(12) United States Patent
Dutta

(10) Patent No.: US 11,955,576 B1
(45) Date of Patent: Apr. 9, 2024

(54) PERPETUAL ENERGY HARVESTER AND METHOD OF FABRICATION THEREOF

(71) Applicant: Achyut Dutta, Sunnyvale, CA (US)

(72) Inventor: Achyut Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 0 days.

(21) Appl. No.: 18/141,220

(22) Filed: Apr. 28, 2023

Related U.S. Application Data

(62) Division of application No. 13/118,399, filed on May 28, 2011, now Pat. No. 11,677,038.

(51) Int. Cl.

| H01L 31/0687 | (2012.01) |
|---|---|
| H01L 31/0224 | (2006.01) |
| H01L 31/0236 | (2006.01) |
| H01L 31/0352 | (2006.01) |
| H01L 31/043 | (2014.01) |
| H01L 31/054 | (2014.01) |
| H01L 31/075 | (2012.01) |
| H01L 31/076 | (2012.01) |

(52) U.S. Cl.
CPC .. *H01L 31/0687* (2013.01); *H01L 31/022425* (2013.01); *H01L 31/022433* (2013.01); *H01L 31/02363* (2013.01); *H01L 31/035218* (2013.01); *H01L 31/035227* (2013.01); *H01L 31/03529* (2013.01); *H01L 31/043* (2014.12); *H01L 31/0543* (2014.12); *H01L 31/0547* (2014.12); *H01L 31/075* (2013.01); *H01L 31/076* (2013.01); *Y02E 10/52* (2013.01); *Y02E 10/544* (2013.01); *Y02E 10/548* (2013.01)

(58) Field of Classification Search
CPC ............... H01L 31/0687; H01L 31/043; H01L 31/0543; H01L 31/0547; H01L 31/022425; H01L 31/022433; H01L 31/02363; H01L 31/032518; H01L 31/035277; H01L 31/03529; H01L 31/075; H01L 31/076
See application file for complete search history.

(56) References Cited

U.S. PATENT DOCUMENTS

| 5,021,100 | A | * | 6/1991 | Ishihara | ................ | H01L 31/078 136/258 |
|---|---|---|---|---|---|---|
| 5,853,497 | A | * | 12/1998 | Lillington | ........... | H01L 31/0687 257/E25.007 |
| 6,340,788 | B1 | * | 1/2002 | King | .................... | H01L 31/0687 136/255 |
| 7,626,116 | B2 | * | 12/2009 | Fetzer | ................... | H01L 31/184 136/262 |

(Continued)

*Primary Examiner* — Golam Mowla

(57) ABSTRACT

An apparatus and method for producing a perpetual energy harvester which harvests ambient near ultraviolet to infrared radiation and provides continual power regardless of the environment. The device seeks to harvest the largely overlooked blackbody radiation through use of a semiconductor thermal harvester, providing a continuous source of power. Additionally, increased power output is provided through a solar harvester. The solar and thermal harvesters are physically connected but electrically isolated. "Perpetual energy harvester" as mentioned in this invention is interpreted to mean an energy harvester which is configured to harvest energy during day and/or night and/or light and/or dark.

20 Claims, 19 Drawing Sheets

(56) References Cited

U.S. PATENT DOCUMENTS

| | | | | |
|---|---|---|---|---|
| 2005/0056312 A1* | 3/2005 | Young | ............ | H01L 31/18 |
| | | | | 136/258 |
| 2005/0155641 A1* | 7/2005 | Fafard | ............ | B82Y 10/00 |
| | | | | 136/255 |
| 2006/0162768 A1* | 7/2006 | Wanlass | ............ | H01L 31/046 |
| | | | | 257/E27.125 |
| 2008/0047600 A1* | 2/2008 | Ohashi | ............ | H01L 31/07 |
| | | | | 257/E31.039 |
| 2008/0078441 A1* | 4/2008 | Poplavskyy | ............ | H01L 31/1804 |
| | | | | 438/96 |
| 2008/0216885 A1* | 9/2008 | Frolov | ............ | H01L 31/076 |
| | | | | 257/E31.027 |
| 2008/0302418 A1* | 12/2008 | Buller | ............ | H01L 31/035281 |
| | | | | 136/265 |
| 2009/0255567 A1* | 10/2009 | Frolov | ............ | H01L 31/042 |
| | | | | 136/246 |
| 2010/0206375 A1* | 8/2010 | Hsu | ............ | H01L 31/046 |
| | | | | 136/256 |
| 2011/0175085 A1* | 7/2011 | Tiwari | ............ | C03C 17/3678 |
| | | | | 257/53 |
| 2018/0182910 A1* | 6/2018 | Paire | ............ | H01L 31/0547 |
| 2021/0351312 A1* | 11/2021 | Lunt, III | ............ | H01L 31/055 |

* cited by examiner

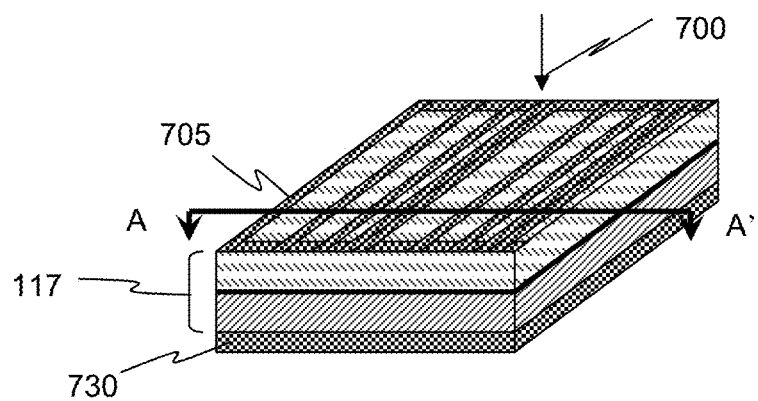
FIG. 7F
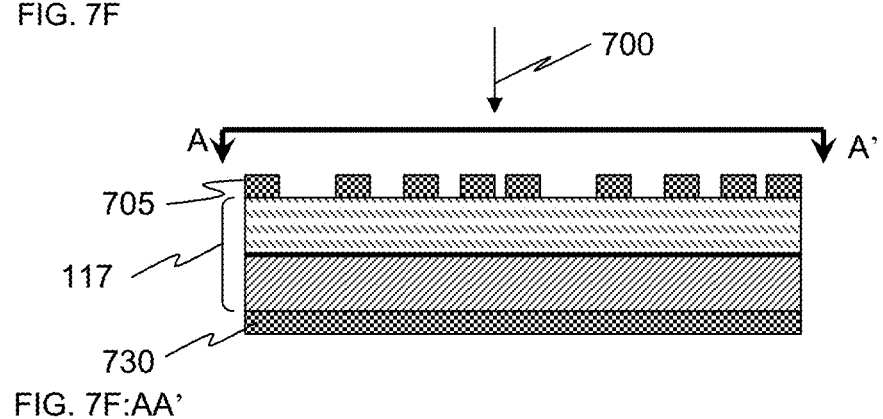
FIG. 7F:AA'
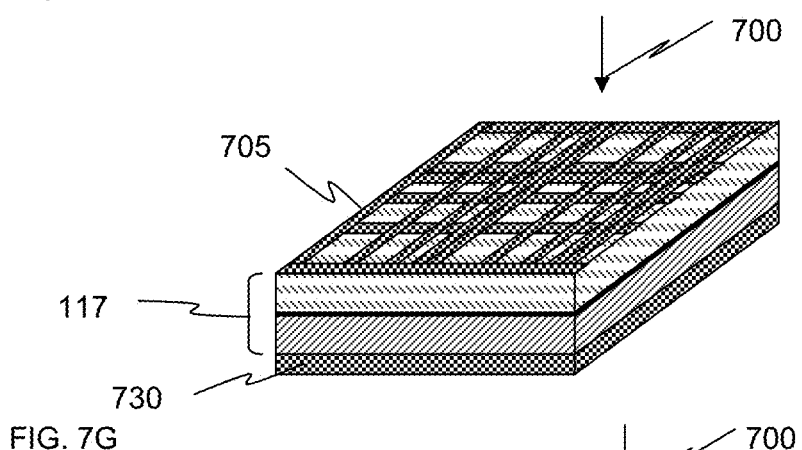
FIG. 7G
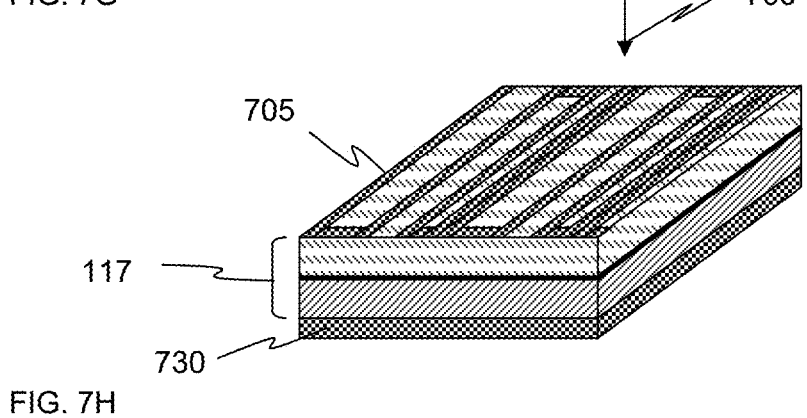
FIG. 7H

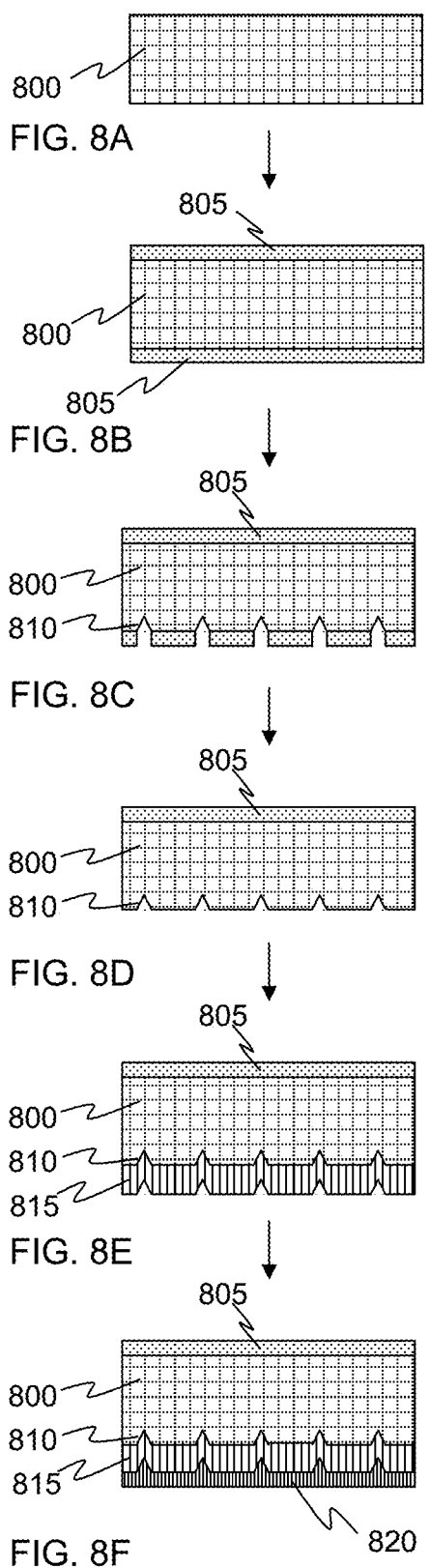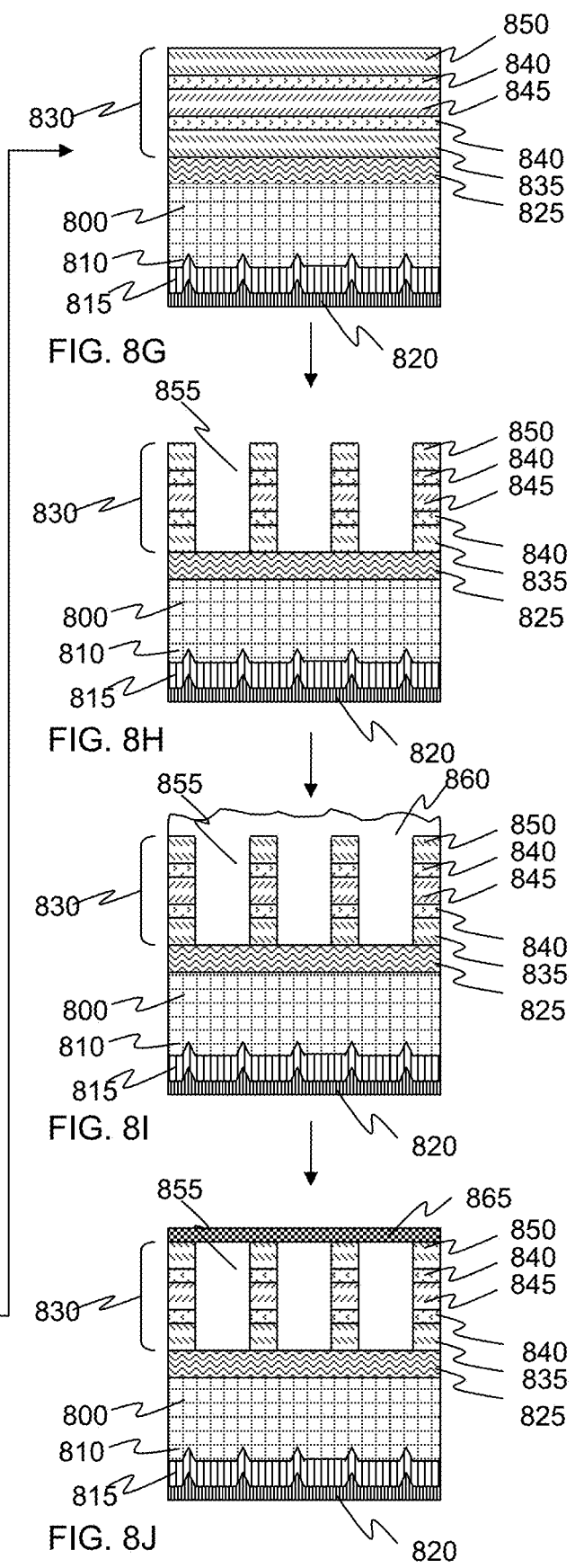

PERPETUAL ENERGY HARVESTER AND METHOD OF FABRICATION THEREOF

This is a divisional of application(s) Ser. No. 13/118,399 filed on May 28, 2011.

FIELD OF THE INVENTION

This invention pertains to harvesting ambient radiation from the near ultraviolet to the infrared spectrum to generate power. More particularly this invention is related to a semiconductor perpetual energy harvesting device that will continually harvest and provide continuous power during both day and night in any environment. Most importantly, "Perpetual energy harvester" as mentioned in this invention is interpreted to mean an energy harvester which is configured to harvest energy during day and night.

BACKGROUND OF INVENTION

Energy harvesting has been around for many years in the form of windmills and watermills. Modern technology has transformed them into wind turbines, hydro-electric plants, and solar panel arrays. These methods of harvesting energy offers two significant advantages over battery powered solutions: virtually inexhaustible resources and little or no adverse environmental effects.

However, the various technologies used in large scale energy harvesting all require a connection to the power grid. Given the trend towards wireless systems, the continuously powered device which never needs to be recharged by connecting to the power grid is the ultimate goal. While ultra-low-power technology is developing, current radiation harvesting devices are very limited. The traditional crystalline silicon, cadmium telluride, and copper indium gallium selenide solar cells only provide power during the daytime. None of the current solutions can provide continuous, around the clock energy harvesting.

BRIEF DESCRIPTION OF THE DRAWINGS

FIG. 7A-L depicts alternative embodiments of the absorption layer incorporating plasmonic nanostructures.

FIG. 8A-J depicts a method for manufacturing a monolithic perpetual energy harvester.

DETAILED DESCRIPTION

Figure 1:
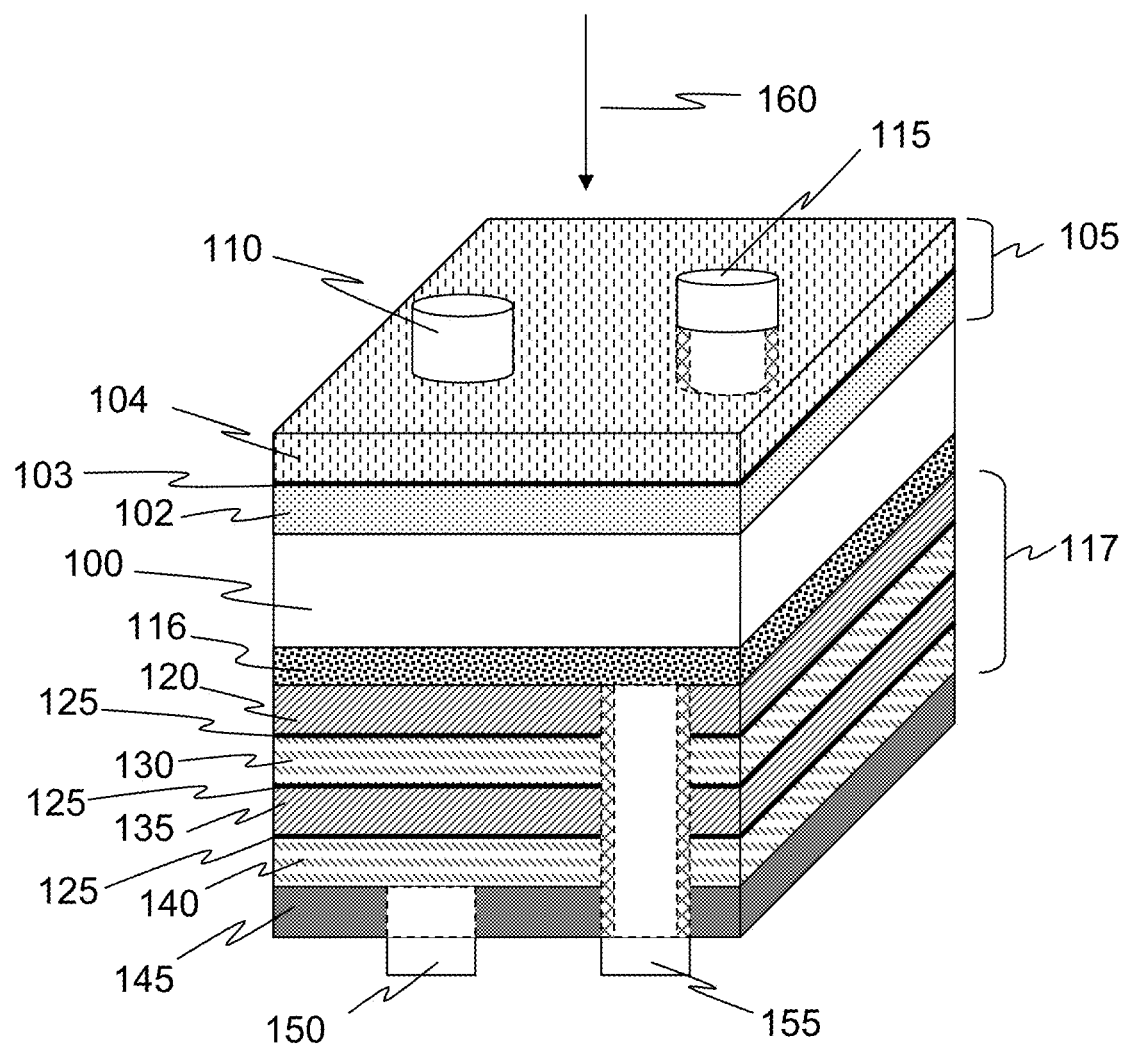
FIG. 1 depicts a cross section of a monolithic structure for a perpetual energy harvester.

Reference is made in detail to the preferred embodiments of the invention. While the invention is described in conjunction with the preferred embodiments, the invention is not intended to be limited by these preferred embodiments. The contemplated embodiments for carrying out the present invention are described in turn with reference to the accompanying figures.

For the purposes this invention, perpetual is defined to be occurring continuously, independent of time, location, or temperature. Energy harvesting for the purposes of this invention is defined to be absorbing radiation and using it to generate a direct current. The term electrically connected is defined to encompass an electrical current flow, including bidirectional, unidirectional, or any hybrid current flow, such as an uneven current.

A photovoltaic device is defined to be a device that absorbs photons to generate a current. The absorption of the photons provides the electrons with the energy to jump the bandgap between the valance band and the conduction band, leaving a positive charge called a hole behind. Each bandgap has a minimum amount of energy required by the electrons to jump the bandgap and the amount may vary depending on the material. The minimum amount of energy may be translated to a cutoff wavelength using Plank's relation:

$$E = \frac{hc}{\lambda},$$

where h is Plank's constant, E is energy, and c is the speed of light. Photons with wavelengths longer than the cutoff wavelength will not provide the necessary energy required to surmount the material's bandgap and will pass through the material.

Photovoltaic devices typically comprise semiconductors configured in p-n or p-i-n junctions. A p-n junction is formed by joining p-type and n-type semiconductors in close contact. A p-i-n junction is similar to a p-n junction, but includes a very low doped intrinsic layer between the p-type and n-type semiconductors. Due to the electric field generated by the diffusion regions of the p-n or p-i-n junctions the electrons and holes are moved in opposite directions generating a current.

Radiation is defined to be the electromagnetic spectrum, particularly the near ultraviolet, visible, near infrared, short-wave infrared, mid-wave infrared, long-wave infrared and far infrared bands. The near ultraviolet band is comprised of wavelengths from about 300 to 400 nm. The visible light band is comprised of wavelengths from about 400 to 780 nm. The near infrared band is comprised of wavelengths from about 0.78 to 1 μm. The short-wave infrared band is comprised of wavelengths from about 1 to 3 μm. The mid-wave infrared band is comprised of wavelengths from about 3 to 6 μm. The long-wave infrared band is comprised of wavelengths from about 6 to 14 μm. The far infrared band is comprised of wavelengths from about 14 to 40 μm. However, the boundary between near ultraviolet radiation and visible light along with the boundary between visible light and infrared radiation is not precisely defined, resulting in overlap between the bands.

Conventional energy harvesting devices are limited to daytime use, because of their sole focus on the visible spectrum. Blackbody radiation has been largely overlooked. The blackbody radiation spectrum ranges from near ultraviolet to the infrared spectrum. The available blackbody radiation can be calculated through Planck's blackbody equation, $$W(\lambda) = \frac{c_1}{\lambda^5 (e^{c_2/\lambda T} - 1)},$$

where $c_1=2\pi c^2 h=37418.32$ $W\mu^4$ $cm^{-2}$ and $c_2=hc/k=14387.86$ K. In $c_1$ and $c_2$, c is the speed of light, k is Boltzmann's constant, h is Planck's constant, $\lambda$ is wavelength, and T is temperature in Kelvin. As temperature increases, power (in watts per meters squared) increases at lower wavelengths. Using Stefan-Boltzmann's law, $5.67 \times 10^{-8} \times T^4$, the total available blackbody radiation at a given temperature can be calculated. At room temperature, about 300 degrees Kelvin, the total available blackbody radiation is estimated to be 500 W/m² with a peak between 4 to 10 nm.

Utilizing Planck's blackbody equation, the amount of power available at a given wavelength and temperature can be calculated. This aids in determining what bandgap to select for the p-n or p-i-n junction to set the cutoff wavelength.

A major difficulty to overcome is the fact that intrinsic carriers cause excessive dark current at high temperature. Infrared detectors share the same problem and are normally operated at 77 degrees Kelvin to minimize dark current. In energy harvesting, dark current will subtract from harvested energy. A solution to this problem will be described under FIG. 2.

FIG. 1 illustrates an embodiment of a monolithic perpetual energy harvester. A perpetual energy harvester is comprised of two photovoltaic devices, a solar harvester and a thermal harvester. The synergy between the solar and thermal harvesters provides a continuous low power output in any environment and a brief, strong power output when visible light is available. In a monolithic embodiment of the invention, the thermal and solar harvesters are physically connected but electrically isolated, each harvester comprising a separate circuit.

The solar harvester and thermal harvester may be connected by a common substrate 100. The substrate 100 may be comprised of group IV semiconductors, group III-V semiconductors, or group II-VI semiconductors. Group IV semiconductors are not limited to but may include Si, polysilicon, SiC, Ge, or SiGe alloy. Group III-V semiconductors are not limited to but may include AlN, GaAs, GaN, InP, GaSb, or InSb. Group II-VI semiconductors are not limited to but may include CdZnTe, HgCdTe, HgZnTe, ZnO, ZnS, CdS, or CdTe. Optionally the substrate may be doped to be either n-type or p-type. Optionally, the substrate 100 may be comprised of silicon on insulator (SOI), dielectric, insulator, polymer, or metal. The material comprising the substrate 100 may be transparent or partially transparent to all or a portion of the spectrum comprising the radiation 160.

The solar harvester 105 may be attached to the top surface of the substrate. Optionally, a buffer layer, not shown, may be included between the substrate 100 and the absorption layers. The buffer layer may be comprised of group IV semiconductors, group III-V semiconductors, or group II-VI semiconductors. Group IV semiconductors are not limited to but may include Si, polysilicon, SiC, Ge, or SiGe alloy. Group III-V semiconductors are not limited to but may include AlN, GaAs, GaN, InP, GaSb, or InSb. Group II-VI semiconductors are not limited to but may include CdZnTe, HgCdTe, HgZnTe, ZnO, ZnS, CdS, or CdTe.

Optionally, the buffer layer may be a similar material system or a dissimilar material system from the substrate 100. A similar material system is defined to be where the element or compound comprising one material are the same as the element or compound comprising a second material. A similar material system includes compounds comprised of the same elements but at different ratios or concentrations. In a similar material system, the materials need not be doped to be the same type. For example, but not to be construed as a limitation, a similar material system may be comprised of a n-type InP substrate and a n-type InP buffer layer. A dissimilar material system is defined to be where the element or compound comprising one material are different from the element or compound comprising a second material. In a dissimilar material system, the materials need not be doped the same type. For example, but not to be construed as a limitation, a dissimilar material system may be comprised of a n-type Si substrate and a n-type CdTe buffer layer. In the present embodiment, for either a similar or dissimilar material system, the buffer layer is doped to be the same type as the substrate 100.

A solar harvester 105 is defined to be a photovoltaic device that absorbs radiation in the visible spectrum to produce electricity. The solar harvester may be comprised of any type of solar cell, including traditional crystallized silicon solar cells, thin film solar cells, and multi-layered solar cells. The material of the solar harvester 105 may be comprised of amorphous silicon, polysilicon, crystalline silicon, Ge, SiGe, CdTe, ZnO, CdZnTe, HgCdTe, HgZnTe, GaAs, GaN, InP, GaSb, or InSb. A solar harvester comprises a first material 102 which may be doped p-type or n-type. A second material 104 of the opposite type, either n-type or p-type, is in close contact with the first material 102. The close contact results in a p-n junction 103. Optionally, an intrinsic material may be included between the p-type and n-type material creating a p-i-n junction. Optionally, a solar harvester may be comprised of multiple p-n or p-i-n junctions. Depending on the material comprising the solar harvester, the cutoff wavelength of the single or multiple p-n or p-i-n junctions may fall within the near ultraviolet, visible, near infrared, and short wave infrared bands. Optionally, the top surface of the solar harvester may be planar or patterned on a nanoscale level to help direct radiation through the solar harvester and subsequent layers.

Alternatively, the solar harvester 105 may be formed on or in the substrate 100 or the buffer layer, not shown. In this alternative embodiment, the substrate 100 is doped to be either p-type or n-type. A material of the opposite type from the substrate, either n-type or p-type, may be attached to the surface of the substrate forming a p-n junction. Optionally, an intrinsic material may be included between the substrate and the material of the opposite type from the substrate to create a p-i-n junction. Alternatively, instead of adding a material of the opposite type, a portion of the substrate 100 may be doped the opposite type creating a p-n or p-i-n junction into the substrate 100.

A first electrode 110 is electrically connected to the top of the solar harvester 105. Optionally, the first electrode 110 may be transparent or semi-transparent to allow the radiation 160 to reach the solar harvester. A second electrode 115 is insulated from all other material and electrically connected to the bottom material in the solar harvester 105, creating a circuit. Alternatively the second electrode may be electrically connected to the substrate 100 or buffer layer, not shown. The second electrode 115 may optionally be transparent, semi-transparent, or non-transparent. The electrodes may be comprised of any suitably conductive material.

Optionally, while the figure illustrates an electrode configuration from the top of the solar harvester, other electrode arrangements may be used resulting in a circuit comprising the solar harvester between the first and second electrodes. For example, but not to serve as a limitation, both electrodes may be configured to enter the device through the substrate 100; one electrode enters from the top of the solar harvester 105 and the other from the substrate 100; or the electrodes may be planar layers located along the top and bottom of the solar harvester 105.

The thermal harvester portion of the device comprises an absorption layer 117 underneath the substrate 100. Optionally, a buffer layer 116 may be included between the substrate 100 and the absorption layer 117. The buffer layer 116 may be comprised of group IV semiconductors, group III-V semiconductors, or group II-VI semiconductors. Group IV semiconductors are not limited to but may include Si, polysilicon, SiC, Ge, or SiGe alloy. Group III-V semiconductors are not limited to but may include AlN, GaAs, GaN, InP, GaSb, or InSb. Group II-VI semiconductors are not limited to but may include CdZnTe, HgCdTe, HgZnTe, ZnO, ZnS, CdS, or CdTe. Optionally, the buffer layer 116 may be a similar material system or a dissimilar material system from the substrate 100. In either material system, the buffer layer is doped to be the same type as the substrate 100.

Attached to the substrate 100 to either the substrate 100 or the buffer layer 116 is an absorption layer 117 comprising at least one junction 125 with cutoff wavelengths in the near infrared, short wave infrared, mid wave infrared, long wave infrared, or far infrared bands. The material comprising the absorption layer 117 may include HgCdTe, HgZnTe, InSb, InAs, GaSb, GaAs, InP, PbTe, or polymer material systems. The absorption layer 117 comprises a first material 120 and second material 130. The first material 120 is doped either p-type or n-type. The second material 130 may be adjacent to the first material 120 and is doped to be the opposite type, creating a p-n junction 125.

Another junction 125 may be formed by including a third material 135 in the absorption layer 117. The third material 135 may be adjacent to the second material 130 and doped such that a p-n junction is created between the second and third materials. Optionally, additional junctions 125 may be formed by incorporating additional materials within the absorption layer 117 and doping the additional layers such that the resulting junctions 125 are p-n or p-i-n junctions.

For example, but not to be construed as a limitation, in a multi-junction similar material system, if the first material 120 is p-type HgCdTe, the second material 130 is then n-type HgCdTe, and the third material 135 is p-type HgCdTe, creating p-n junctions between each material. In creating additional junctions 125, the fourth material 140 is n-type HgCdTe, creating an additional p-n junction.

Optionally, an intrinsic semiconductor material, not shown, may be included between the p-type and n-type materials to create p-i-n junctions. While FIG. 1 illustrates three junctions in the thermal harvester, any number of junctions may be used.

The junctions 125 that are contemplated to be homo-junctions with each junction 125 comprised of similar material systems. Optionally, each junction 125 may be comprised of a different material. For example, but not to serve as a limitation, a two junction thermal harvester may be comprised of a HgCdTe junction and a InSb junction. The HgCdTe junction is comprised of a p-type HgCdTe material and an n-type HgCdTe material. The InSb junction is comprised of a n-type InSb material and a p-type InSb material.

Optionally, hetero-junctions may be used where the first material 120 and second material 130 composing the junction are comprised of different materials. For example, but not to serve as a limitation, in a two junction harvester comprised of three materials, the first material 120 may be comprised of p-type HgCdTe, the second material 130 may be comprised of n-type InSb, and the third material 135 may be comprised of p-type PbTe.

Each junction 125 is designed to absorb radiation within a targeted or desired range. The longest wavelength of photons that can be absorbed by the material is called the cutoff wavelength. The cutoff wavelengths for the thermal harvester junctions are located within the near infrared, short wave infrared, mid wave infrared, long wave infrared, and far infrared bands. The cutoff wavelength for the junction may be adjusted by varying the concentration of an element of the semiconductor material comprising the absorption layer 117. For example, but not to serve as a limitation, in a contemplated use of $Hg_{1-x}Cd_xTe$, adjusting the concentration of Cd in the compound determines the bandgap of the material. The bandgap may range from 0 to 1.5 eV, with higher concentrations of Cd resulting in a larger bandgap. Thus, the desired cutoff wavelengths at each junction may be obtained through selecting the appropriate concentration of Cd for the material comprising the junction. Each material in the absorption layer may comprise either different or similar concentrations of Cd. Optionally, the desired cutoff wavelength may also be adjusted by altering the thickness of the semiconductor materials. In the present embodiment, the thickness of the materials is such that electron tunneling will occur.

Any intrinsic material in the absorption layer 117 will be as doped as low as possible, generally a concentration of $10^{15}/cm^3$ or less. The p-type and n-type materials will contain high doping concentrations, typically ranging from $10^{17}/cm^3$ to $10^{18}/cm^3$, but not to the levels of degradation at room temperature.

Adjacent to the absorption layer 117 is an insulator layer 145. The insulator layer 145 may be comprised of an oxide layer or metal. A third electrode 150 is electrically connected to the material in the absorption layer 117 adjacent to the insulator layer 145. Optionally, if the insulator layer 145 is comprised of metal, it may serve as the third electrode 150. A fourth electrode 155 is electrically connected to first material 120 and insulated from all other materials. Optionally, the fourth electrode 155 may be electrically connected to the substrate 100 or buffer layer 116. Optionally, if the substrate 100 is comprised of metal, it may serve as the fourth electrode 155. The electrodes may be comprised of any suitably conductive material.

Optionally, while the figure illustrates an electrode configuration that passes through the insulator layer 145, other electrode arrangements may be used resulting in a circuit comprising the junctions 125 in series between the first and second electrodes. For example, but not to serve as a limitation, in one configuration both electrodes may be configured to enter the device through the substrate 100; in another configuration one electrode passes through the insulator layer 145 and the other from the substrate 100; or in a third configuration the electrodes may be planar layers located on either side of the absorption layers 117.

In an alternate configuration, the energy harvester may comprise a configuration of three electrodes with the solar and thermal harvesters sharing a common electrode, not shown. In this configuration, a first electrode may be electrically connected to the surface of the absorption layer 117 attached to the insulator layer 145. A second electrode may be electrically connected to the top of the solar harvester. A third electrode may be electrically connected to the substrate 100 and serve as a common electrode for both the solar and thermal harvesters.

Optionally, in an alternate embodiment the absorption layer 117 may be comprised of an electrolyte layer, not shown. The electrolyte layer may be comprised of any electrolyte material comprising free ions and may be liquid, gel, or solid. The electrodes electrically connected to the electrolyte layer comprise an anode and a cathode. The anode, the cathode, or both may serve as a photo-electrode. In one embodiment of the electrolyte layer, the cathode may be comprised of any metal and the anode may be a photo-anode comprised of an n-type semiconductor. Optionally, if the buffer layer 116 or substrate 100 is n-type, it may serve as a photo-anode.

In an alternate embodiment, the anode may be a photo-anode comprised of a n-type semiconductor and the cathode may be a photo-cathode comprised of a p-type semiconductor. Optionally, if the buffer layer 116 or substrate 100 is n-type, it may serve as a photo-anode. Alternatively, if the buffer layer 116 or substrate 100 is p-type, it may serve as a photo-cathode.

In another alternate embodiment the anode may be comprised of metal and the cathode may be a photo-cathode comprised of a p-type semiconductor. Optionally, if the buffer layer 116 or substrate 100 is p-type, it may serve as a photo-cathode. In all the electrolyte layer embodiments, the electrolyte and the photo-electrodes absorb the incoming radiation and generate electricity.

Optionally, in an alternate embodiment, the absorption layer may be comprised of a dye-sensitized layer comprising nanoparticles coated in radiation-sensitive dye and an electrolyte material. The nanoparticles may be comprised of various metals or metal oxides. For example, but not to serve as a limitation, the materials comprising the nanoparticles may be $TiO_2$, ZnO, etc. The dye-sensitized layer may serve as the anode and a separate electrode may serve as a cathode. The cathode may be comprised of any metal, e.g. platinum, cobalt sulfide, etc. Optionally, the absorption layer may be comprised of a hybridized material system, resulting from a combination of dye, electrolyte, and/or semiconductor materials.

This device is oriented to absorb radiation 160 arriving from the indicated direction by first passing through the solar harvester 105 before reaching the multiple junctions 125 of the thermal harvester. The radiation 160 is comprised of the near ultraviolet, visible, near infrared, short-wave infrared, mid-wave infrared, long-wave infrared, and far infrared bands.

Figure 2:
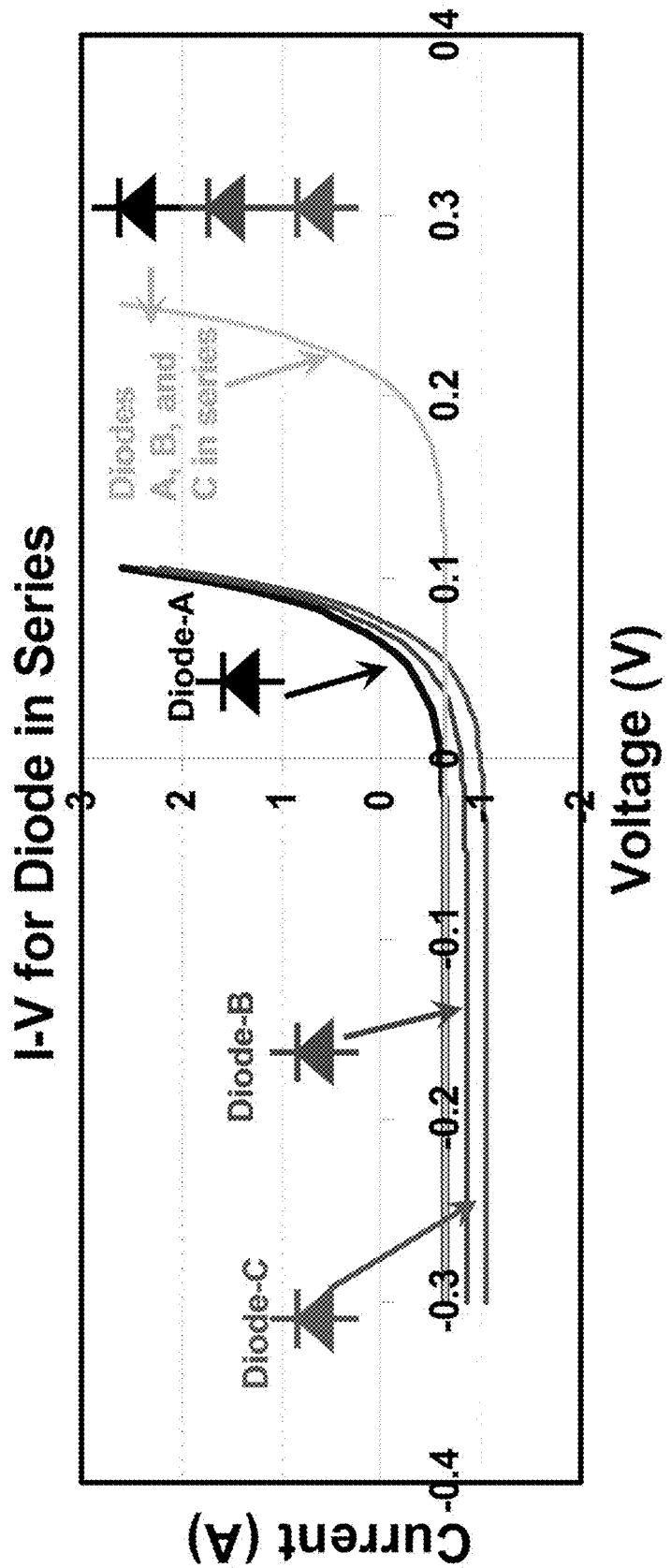
FIG. 2 depicts a current-voltage characteristic chart for multiple harvester junctions in series.

FIG. 2 depicts the current-voltage characteristic of junctions in a multiple junction energy harvester, both individually and connected in series. Each individual junction may be represented as a diode with its own current-voltage (I-V) characteristic. The diodes A, B, and C illustrate that each junction generates a current with a different magnitude. Multiple junctions stacked together may be represented as diodes connected in series. The result is increased open circuit voltage but the magnitude of the current is equal to the lowest magnitude current generated by the diodes, leading to increased power generation. For example, but not to serve as a limitation, when diodes A, B, and C are connected in series, the voltage, $V_d$, is increased from under 0.1 V, for each individual diode, to over 0.2 V. The current of the diodes in series is then equal to the current generated by diode A, the lowest magnitude current. This increased open circuit voltage minimizes the problem excessive dark current or reverse bias leakage current causes in intrinsic carriers at high temperatures because dark current subtracts from harvested energy. With no limitation to low operating temperatures to minimize the dark current, the perpetual energy harvester has the ability to operate in any environment.

Figure 3A:
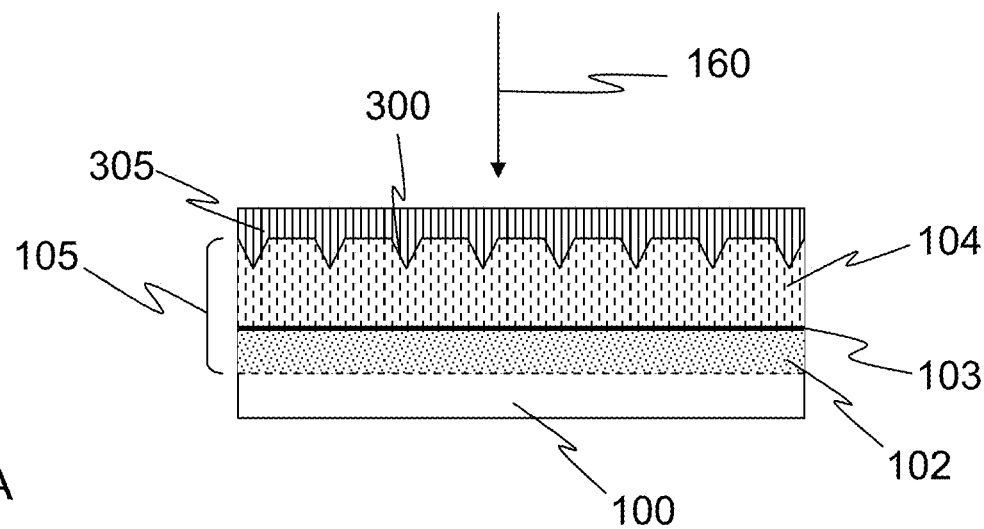
FIGS. 3A and 3B depicts various configurations of a solar harvester's junctions.

FIGS. 3A and B illustrates cross-sections of various solar harvester 105 embodiments. The electrodes in these embodiments are not shown, but are configured as described in FIG. 1. FIG. 3A shows the solar harvester 105 with an embedded planar junction 103. The junction 103 is formed where a p-type or n-type material 102 comes into close contact with a second material 104 doped the opposite type, creating a p-n junction. Optionally, an intrinsic layer, not shown, may be included between the p-type and n-type materials, forming a p-i-n junction. Optionally, nanoscale grooves 300 or another nanoscale pattern may be created on the top surface of the solar harvester 105. These grooves 300 or pattern serve an antireflective purpose to direct radiation through the solar harvester 105, the substrate 100, and subsequent layers. The grooves 300 may be etched into the solar harvester or created by adding material to the surface of the solar harvester 105. Optionally, an antireflective coating 305 may be included over the grooves 300 or pattern to direct radiation through the solar harvester 105, the substrate 100, and subsequent layers. The anti-reflective coating 305 may be comprised of a single or multiple layers of anti-reflective material and may be planar or non-planar. Optionally, the anti-reflective coating 305 may be comprised of nanocrystals or photonic crystals to control the direction of light propagation. The antireflective coating may be comprised of $SiO_2$, $SiN_x$, ZnO, metal oxide, insulator, or semiconductor.

Figure 3B:
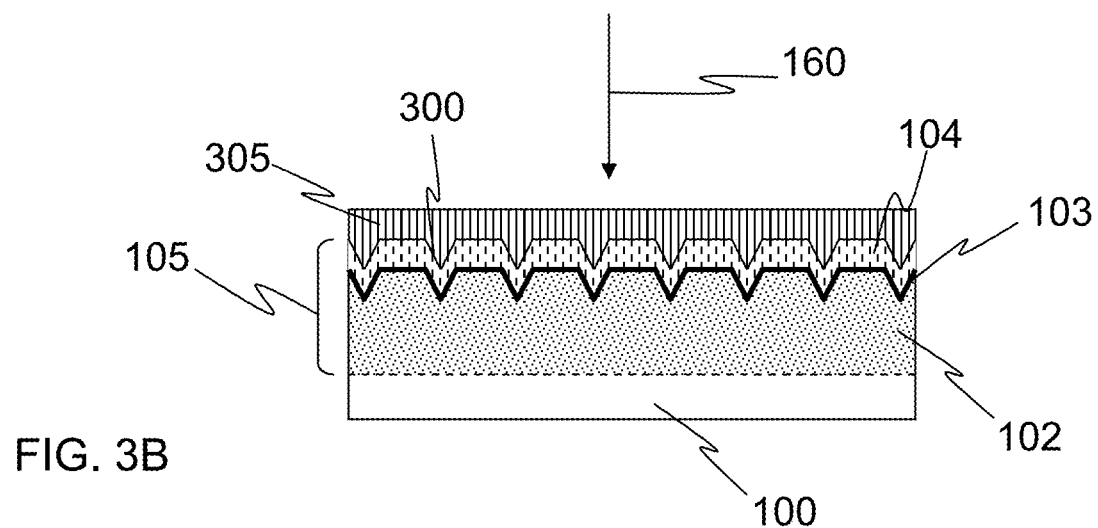

FIG. 3B shows a solar harvester 105 with the junction 103 near the surface of the device. The solar harvester 105 may be comprised of amorphous silicon, polysilicon, crystalline silicon, Ge, SiGe, CdTe, ZnO, CdZnTe, HgCdTe, HgZnTe, GaAs, GaN, InP, GaSb, InSb. Alternatively, the solar harvester may be comprised of multiple junctions with each junction comprised of a different material. For example, a triple junction may be comprised of a junction comprising GaAs, another comprising Ge, and the third comprising InGaP.

The junction 103 in this embodiment may conform to any optional grooves 300 or patterns created on the surface of the solar harvester 105. The conforming junction 103 may be accomplished through traditional deposition, growth, or doping techniques. The grooves 300 or pattern serve an antireflective purpose to direct radiation through the solar harvester 105. Additionally, having the junction 103 conform to the grooves 300 or pattern increases the surface area for absorbing photons, increasing the efficiency of the solar harvester and generating more power. Optionally, an anti-reflective coating 305 as described in FIG. 3A may be included over the grooves 300 or pattern.

Figure 4A:
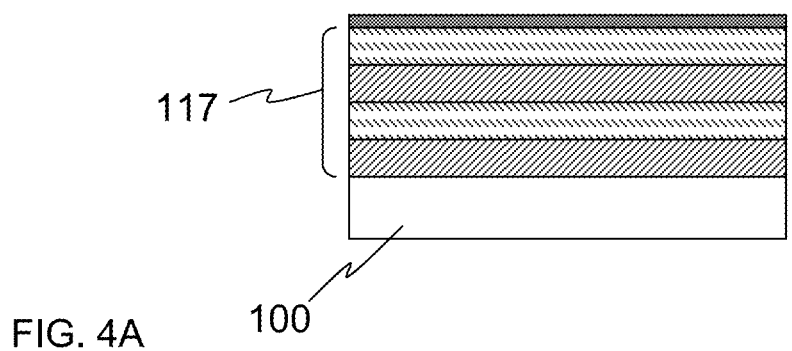
FIGS. 4A-I depicts various compositions of the thermal harvester's junctions.

FIG. 4A-I illustrates various embodiments for multiple junctions. While these embodiments are contemplated for the thermal harvester portion of the device, they may be applied to the solar harvester. The electrodes in these embodiments are not shown, but are configured as described in FIG. 1. FIG. 4A illustrates planar or level materials on top of the substrate 100. The material comprising the absorption layer 117 are created with controlled thickness and density. The materials comprising the absorption layer 117 are as described in FIG. 1. While the figure shows materials of even thickness or width, the width of the material may be altered depending on the desired cutoff wavelength.

Figure 4B:
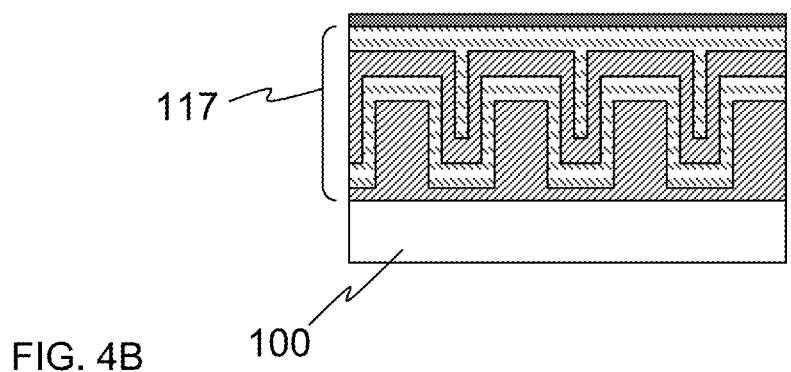

FIG. 4B illustrates an alternative embodiment of the absorption layer 117. The materials comprising the absorption layer 117 are patterned using three-dimensional structures to increase the surface area of the junctions. The thickness and density of the material comprising the junctions are controlled. This may be done through a top down fabrication approach where each layer is planarized and etched prior to the creation of the subsequent layers. Alternatively, the patterns may be formed through a controlled epitaxial growth process. While the figure depicts the three-dimensional structures pattern as rectangular waves, the three-dimensional structures may be comprised of any patterns that increase the surface area while controlling thickness and density of the materials. For example, but not to act as a limitation, sinusoidal waves, triangular waves, arc-shaped waves, columns, cylinders, cones, pyramids, polygonal structures, etc.

Figure 4C:
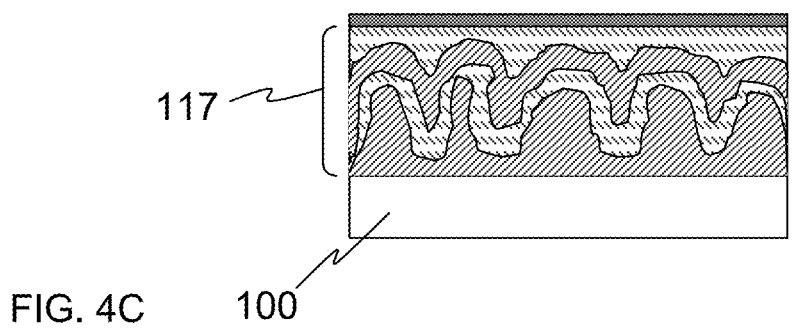

FIG. 4C illustrates another embodiment of a patterned absorption layer 117 which utilizes self-assembly. The materials comprising the absorption layer 117 are not controlled in their density or thickness and may be created using a bottom-up approach, where each material utilizes a self assembled monolayer. Alternatively, other self-assembly techniques may be used. While the figure depicts a wave pattern, other three dimensional patterns may be used which increase the surface area and do not control the density of the materials. For example, but not to act as a limitation, sinusoidal waves, triangular waves, arc-shaped waves, columns, cylinders, cones, pyramids, polygonal structures, etc.

Figure 4D:
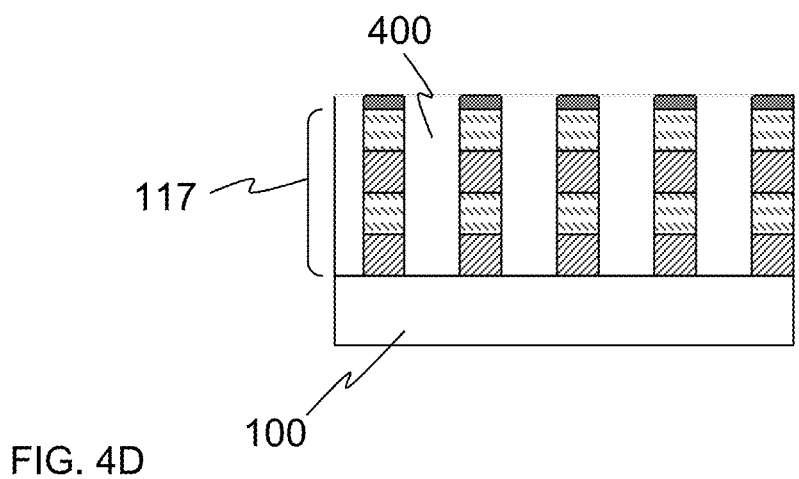

FIG. 4D illustrates another embodiment of the absorption layer 117 with trap structures 400. The trap structures 400 may include any type of formation which traps radiation by reflecting, refracting, or scattering photons within the formation until the photons are absorbed by a junction. The formations may be comprised of gaps, as illustrated in FIG. 4D, or patterned junctions, as illustrated in FIGS. 4B and C. While the trap structures 400 depicted in the embodiment are gaps in the form of columns, other shapes or configurations may be used which trap radiation by reflecting, refracting, or scattering photons. The materials comprising the trap structures 400 may be air, which results in gaps in the insulator layer between the formations.

Figure 4E:
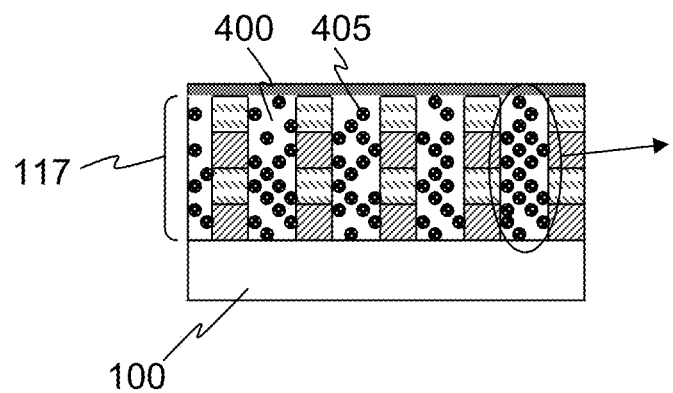

FIG. 4E illustrates an alternate embodiment where the trap structures 400 may be comprised of nanocrystals or nanostructures 405, materials transparent to the wavelengths of radiation to be trapped, and/or materials comprising insulating properties. The nanocrystals or nanostructures 405 may be comprised of nanoparticles, nanowires, nanodots, nanorods, nanotubes, nanocones, branched nanostructures, nanobipods, nanotripods, nanotetrapods, quantum dots, nanopillars, H shaped structures, cavity structures, crescent structures, chiral or asymmetric structures, or any other structural configurations or combinations of the aforementioned. The materials comprising the nanocrystals or nanostructures 405 may include semiconductors, metals, dielectrics, ferroelectrics, insulators, polymers, or a combination of materials. Optionally, the nanocrystals or nanostructures 405 may be the same size or varying sizes. The nanocrystals or nanostructures 405 may fill the trap structure and/or be embedded into a polymer or insulating material. The material in which the nanocrystals or nanostructures 405 are embedded is transparent to the wavelengths of radiation to be trapped. The nanocrystals or nanostructures 405 assist in enhancing the scattering of photons within the trap structure 400.

Figure 4F:
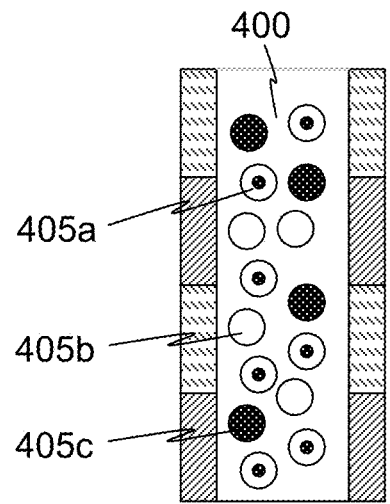

The materials comprising insulating properties may include compounds, nanocrystals, embedded nanostructures, or any nanostructure having insulating properties. For example, but not to serve as a limitation, compounds comprising insulating properties may include $SiO_2$, AlN, $AlO_3$, or $SiN_x$. FIG. 4F illustrates an embodiment of nanocrystals, embedded nanostructors, or nanostructures having insulating properties. The nanocrystals may be comprised of a core-shell configuration 405a. The core may be comprised of a metal, semiconductor, dielectric, insulator, polymer, or ferroelectric material. The shell surrounding the core may comprise a single or multiple layers. For example, a metal core may be surrounded by an insulator coating. Alternatively, the nanostructure may be comprised solely of an insulator material 405b. Alternatively, the trap structure may be filled with insulating material and the nanostructure may be comprised of metal embedded into the insulating material 405c. In addition to aiding the reflection, refracting, or scattering of the trap structure, utilizing materials or nanostructures with insulating properties also prevents potential short circuits.

The trapping, reflecting, refracting, or scattering of the radiation within the trap structures 400 until the radiation is absorbed by a junction increases the efficiency of the thermal harvester. In addition, the trap structures 400 slightly increase the cutoff wavelength for each junction, allowing each junction to absorb a slightly wider range of radiation. Moreover, while the figure illustrates an absorption layer 117 comprised of planar materials, trap structures may also be made in absorption layers 117 not comprised of planar materials.

Figure 4G:
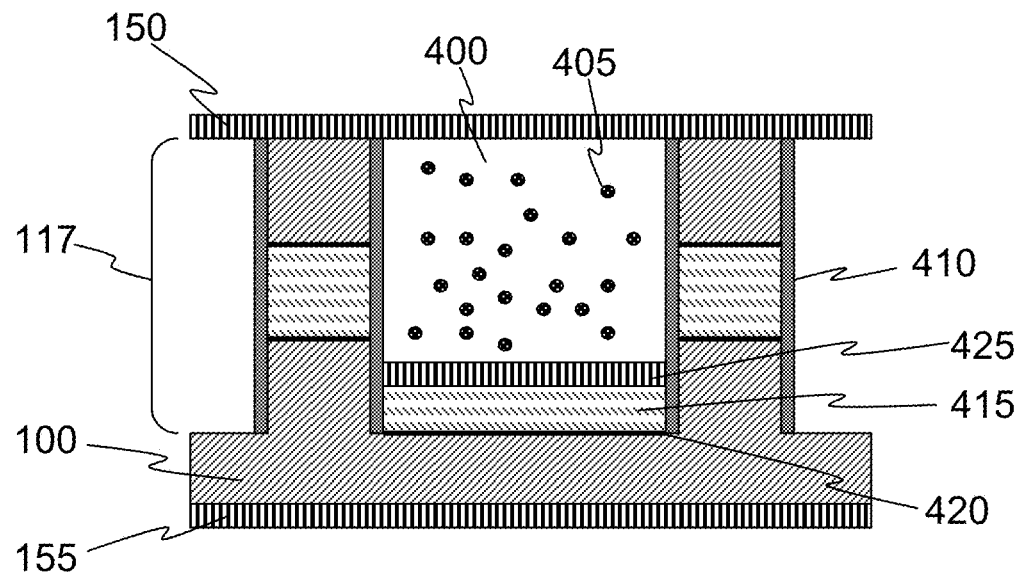

FIG. 4G depicts an alternate embodiment of a trap structure. The electrodes 150 and 155, substrate 100, and absorption layer 117 are as described in FIG. 1. The trap structure 400 and nanostructures 405 are as described above in FIGS. 4D and E. Optionally, insulators 410 may line the sides of the trap structure 400. A material layer 415 is located along the bottom of the trap structure 400. The material layer 415 may comprise a similar or dissimilar material system from the substrate 100 or buffer layer, not shown. The material layer 415 is doped to be the opposite type of the substrate 100 or buffer layer, creating a p-n junction 420. Optionally, an intrinsic material may be included between the material layer 415 and the substrate 100 or buffer layer to create a p-i-n junction, not shown. The cutoff wavelength for the junction 420 within the trap structure 400 may be different from the cutoff wavelengths of the junctions comprising the absorption layer 117. For example, but not to serve as a limitation, the cutoff wavelengths for the absorption layer 117 may be located within the short wave and mid wave infrared bands, while the cutoff wavelength for the junction 420 may be within the long wave infrared bands. This design increases the efficiency of the harvester by trapping the photons to be absorbed by the absorption layer while adding the capability to absorb photons that exceed the cutoff wavelength of the absorption layer. Optionally, additional p-n or p-i-n junctions may be created in the trap structure by adding additional material layers. An electrode 425 is on top of the material layer 415 in the junction.

Optionally, in an alternate embodiment the trap structure may comprise an electrolyte layer, not shown. The electrolyte layer may be comprised of any electrolyte material comprising free ions, an anode, and a cathode. The electrolyte material may be a liquid, gel, or solid. The anode, the cathode, or both may serve as a photo-electrode. In one embodiment of the electrolyte layer, the cathode may be comprised of metal and the anode may be a photo-anode comprised of an n-type semiconductor. Optionally, if the buffer layer or substrate is n-type, it may serve as a photo-anode.

In an alternate embodiment, the anode may be a photo-anode comprised of a n-type semiconductor and the cathode may be a photo-cathode comprised of a p-type semiconductor. Optionally, if the buffer layer or substrate is n-type, it may serve as a photo-anode. Alternatively, if the buffer layer or substrate is p-type, it may serve as a photo-cathode.

In another alternate embodiment the anode may be comprised of metal and the cathode may be a photo-cathode comprised of a p-type semiconductor. Optionally, if the buffer layer or substrate is p-type, it may serve as a photo-cathode. In all the electrolyte layer embodiments, the electrolyte and the photo-electrodes absorb the incoming radiation and generate electricity. Optionally, the electrolyte layer may comprise a different cutoff wavelength from the junctions comprising the absorption layer 117, thereby increasing the efficiency of the energy harvester in addition to trapping photons to be absorbed by the junctions in the absorption layer.

Optionally, in an alternate embodiment, the trap structure may include an electrolyte material and a dye-sensitized layer comprising nanoparticles coated in radiation-sensitive dye, not shown. The nanoparticles may be comprised of various metals or metal oxides. For example, but not to serve as a limitation, the materials comprising the nanoparticles may be $TiO_2$, ZnO, etc. The dye-sensitized layer may serve as the anode and a separate electrode may serve as a cathode. The cathode may be comprised of any metal, e.g. platinum, cobalt sulfide, etc. Optionally, the absorption layer may be comprised of a hybridized material system, resulting from a combination of dye, electrolyte, and/or semiconductor materials.

Figure 4H:
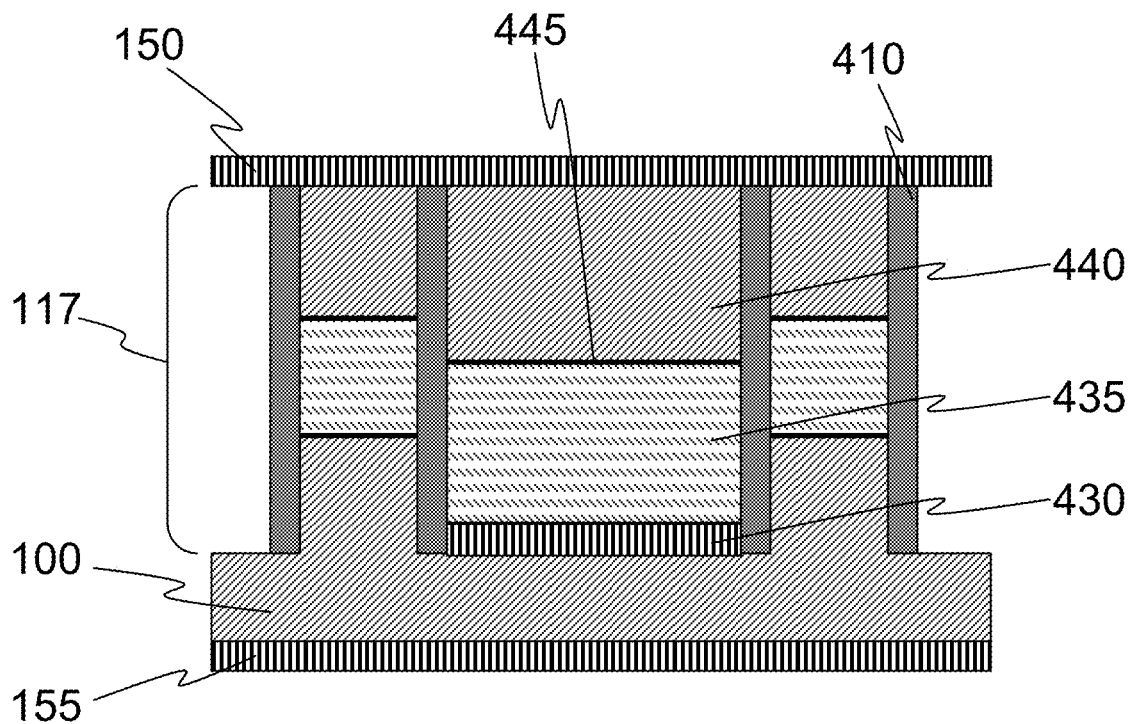

FIG. 4H depicts an alternate embodiment of a trap structure. The electrodes 150 and 155, substrate 100, and absorption layer 117 are as described in FIG. 1. In this embodiment the trap structure comprises a second absorption layer. Optionally, an insulator material 410 may line the sides and/or bottom of the trap structure 400. An electrode 430 is electrically connected to the bottom of the second absorption layer within the trap structure 400. The second absorption layer comprises at least two semiconductor materials 435 and 440. The semiconductor materials may be comprised of group IV semiconductors, group III-V semiconductors, or group II-VI semiconductors. The materials used for the second absorption layer are transparent to the wavelengths of radiation intended to be trapped by the trap structure. The semiconductor materials 435 and 440 are doped opposite types to form a p-n junction 445. Optionally, a third intrinsic material may be included between the p-type and n-type semiconductor materials to form a p-i-n junction. Optionally, additional semiconductor materials may be included in the second absorption layer to create multiple p-n or p-i-n junctions. The cutoff wavelengths of the junctions comprising the second absorption layer may be different from the cutoff wavelengths of the junctions comprising the first absorption layer 117. For example, the cutoff wavelength of the second absorption layer may be outside the range of the first absorption layer's cutoff wavelength. The second absorption layer is transparent to the wavelength of radiation intended to be trapped and absorbed by the first absorption layer. This increases the harvester's efficiency by trapping radiation to be absorbed by the first absorption layer and allows the harvester to absorb a wider spectrum to generate power. The second absorption layer may share a common electrode with the first absorption layer 117. In this embodiment, the top of the second absorption layer may be electrically connected to the common electrode 150.

Figure 4I:
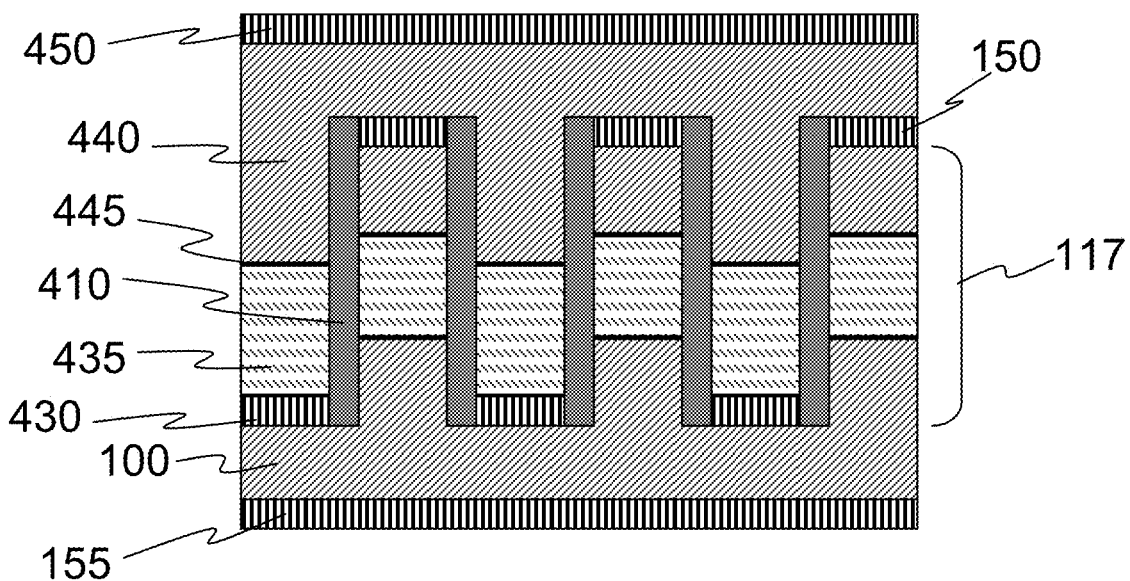

Alternatively, the second absorption layer may not share a common electrode with the first absorption layer, as shown in FIG. 4I. In this alternate embodiment, the electrode 150 electrically connected to the top of the first absorption layer comprises gaps over the trap structures. The top of the second absorption layer is electrically connected to a separate electrode 450. The second absorption layer may have a different cutoff wavelength from the first absorption layer and is transparent to wavelengths of radiation to be absorbed by the first absorption layer. This structure electrically isolates the two absorption layers.

Figure 5A:
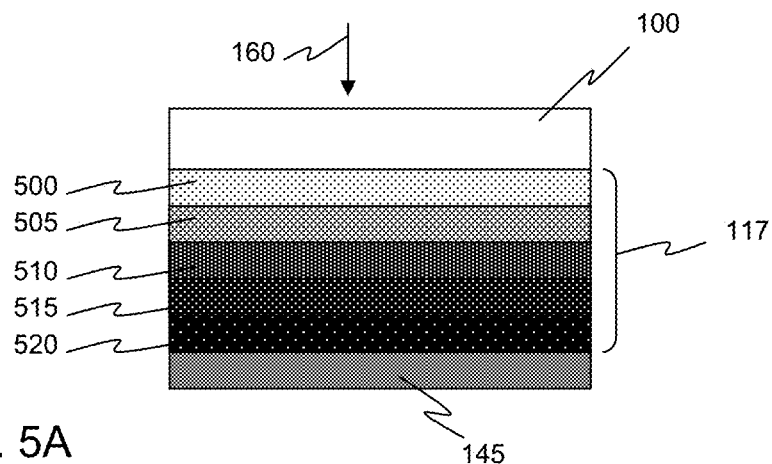
FIGS. 5A-C depicts various cutoff wavelength configurations for the thermal harvester's junctions.
Figure 5B:
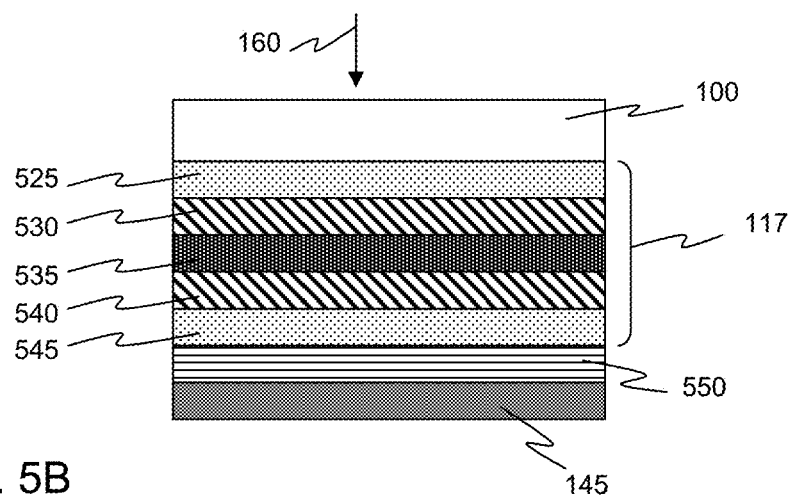
Figure 5C:
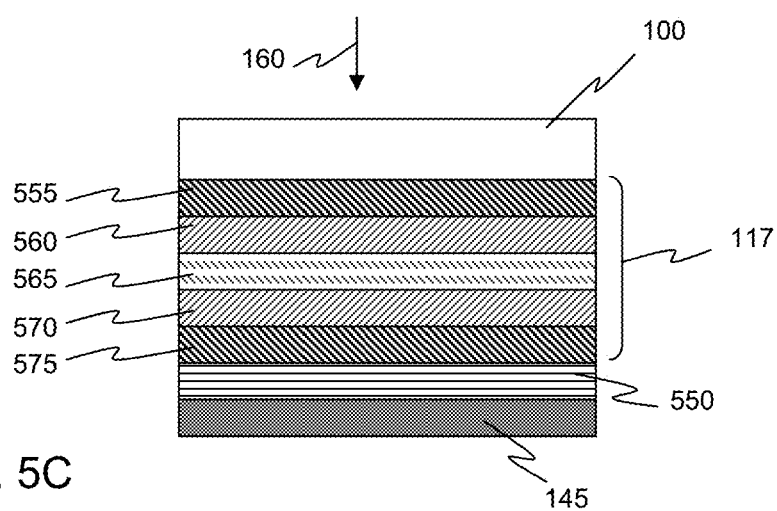

FIG. 5A-C depicts alternative embodiments for configuring the junctions 125 in a multi-layered harvester's absorption layer 117, which are described above in FIG. 1. The electrodes in these embodiments are not shown, but are configured as described in FIG. 1. For clarity of explanation, the shaded layers represent junctions 125, not materials. While each figure depicts five junctions, any number of junctions may be used.

FIG. 5A illustrates an embodiment of the absorption layer 117 where the junctions 125 are arranged in ascending order of cutoff wavelengths in relation to the direction of the incoming radiation 160. In the depicted embodiment, the radiation 160 approaches the device from the direction of the substrate 100. The junction with the shortest cutoff wavelength 500 is located closest to the substrate 100. The junction with the second shortest cutoff wavelength 505 is attached on top of the shortest cutoff wavelength junction 500. The sequence continues until the junction with the longest cutoff wavelength 520 is located furthest from the substrate 100 and adjacent to the insulator layer 145.

For example, but not to serve as a limitation, each layer may be designed to absorb radiation in different bands. The shortest cutoff wavelength junction 500 may be designed to absorb radiation in the near infrared band. The next junction 505 may be designed to absorb radiation in the short-wave infrared band. The following junction 510 may be designed to absorb radiation in the mid-wave infrared band. The subsequent junction 515 may be designed to absorb radiation in the long-wave infrared band. The last junction 520 may be designed to absorb radiation in the far infrared band.

In an alternate embodiment where the radiation 160 approaches the device from the insulator layer 145, not shown, the junction with shortest cutoff wavelength 500 is located adjacent to the insulator layer 145. The subsequent junctions are arranged in order of ascending cutoff wavelengths with the junction with the longest cutoff wavelength 520 adjacent to the substrate 100.

FIG. 5B illustrates an embodiment of the absorption layer 117 with junctions 125 in a long central wavelength configuration, where the longest cutoff wavelength junction 535 is located between junctions that have shorter cutoff wavelengths. In the depicted embodiment, the junction with the longest cutoff wavelength 535 is in the center and is surrounded by the junctions with the next longest cutoff wavelengths 530 and 540. The junctions with the shortest cutoff wavelengths 525 and 545 are located furthest away from the center layer 535. Alternatively, the junctions may be arranged in ascending cutoff wavelengths until reaching the longest cutoff wavelength junction 535 and begin ascending again starting with the junctions with the shortest cutoff wavelength.

The reflective layer 550 is comprised of a material which reflects the radiation back through the junctions 125. Examples of this material may include various types of metals or metamaterials, including electromagnetic bandgap metamaterials such as photonic crystals or left handed materials which control the direction of light propagation. This configuration increases efficiency by allowing energy to be absorbed from radiation coming from multiple directions. For example, but not to serve as a limitation, the radiation to be harvested may arrive by passing through the insulator layer 145, be reflected after passing unabsorbed through the junctions 125, or pass through the substrate 100.

FIG. 5C illustrates an embodiment for the absorption layer 117 in a short central wavelength configuration, where the longest cutoff wavelength junctions 555 and 575 are located adjacent to the substrate 100 and reflective layer 550, with the shorter cutoff wavelength junctions 560, 565, and 570 located in between. In the present depiction, the junction with the shortest cutoff wavelength 565 is located in the center. Optionally, this embodiment may apply to any configuration where a junction with a shorter cutoff wavelength is between junctions with longer cutoff wavelengths. This configuration has similar capabilities as the configuration described in FIG. 5B.

FIG. 6A-J depicts various embodiments of junctions incorporating plasmonic nanostructures. The electrodes in these embodiments are not shown, but are configured as described in FIG. 1. Plasmonics is defined to be the effect certain nanostructure surfaces to absorb and intensify light at specific wavelengths due to the collective oscillation of electrons. In the presence of radiation, if plasmonic nanostructures are in close proximity at a nanoscale level, a heavy electric field is generated. The plasmonic nanostructures may be arranged to utilize the heavy electric field to enhance the drift current of the junction. Plasmonic nanostructures may be comprised of metals, dielectrics, ferroelectrics, insulators, or semiconductors with absorption capabilities in the desired spectrum region. The use of plasmonic nanostructures increases the efficiency of the energy harvester by enhancing the drift current of the junctions to reduce electron-hole recombination and scattering the incoming radiation 600 within the structure through reflection and refraction to enable a greater amount of energy harvested. The radiation 600 may be comprised of the near ultraviolet to far infrared spectrum. Plasmonic nanostructures may be used in both the solar and thermal harvester portions of the device.

Figure 6A:
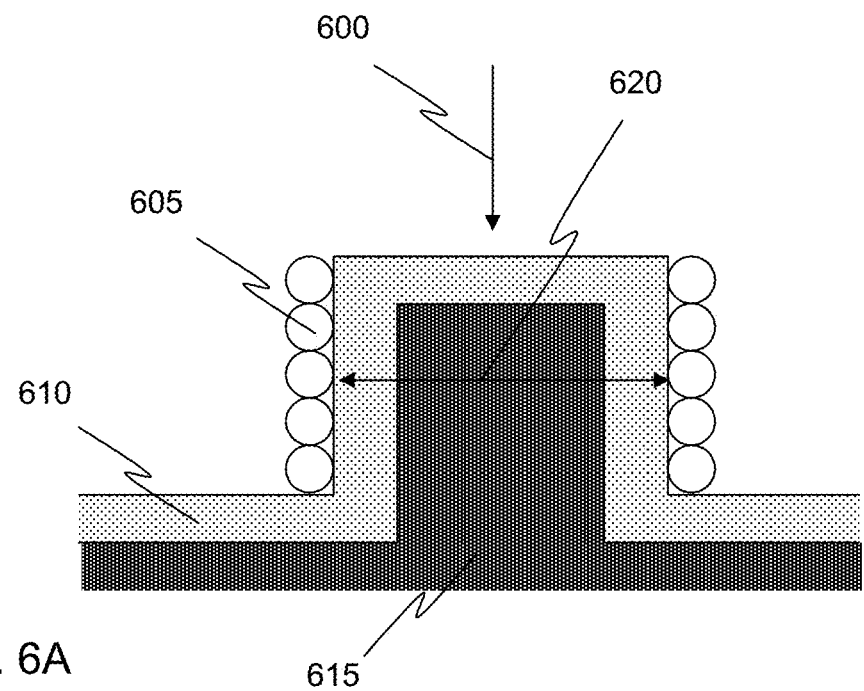
FIGS. 6A-J depicts various embodiments of junctions incorporating plasmonic nanostructures.

FIG. 6A depicts an embodiment of a junction with plasmonic nanostructures. A first material 615 is patterned on a nanoscale level. The material 615 may be doped either p-type or n-type. A second material 610 conforms to the patterned first material 615. The second material 610 may be doped either n-type or p-type, such that the first and second materials form a p-n junction. The plasmonic nanostructures 605 are arranged along the second material 610. Optionally, the plasmonic nanostructures 605 may be embedded within the second material 610, not shown. The plasmonic nanostructures 605 may be comprised of nanoparticles, nanowires, nanodots, nanorods, nanotubes, nanocones, branched nanostructures, nanobipods, nanotripods, nanotetrapods, quantum dots, nanopillars, H shaped structures, cavity structures, crescent structures, chiral or asymmetric structures, or other structural configurations or a combination of the aforementioned. Optionally, the nanostructures may be solid or hollow, allowing for a core-shell configuration, with single or multiple shell layers. The material comprising the plasmonic nanostructures 605 may be any type of semiconductor, metal, dielectric, insulator, or ferroelectric materials. For example, but not to be construed as a limitation, semiconductors may include Si, Ge, InP, GaAs, CdSe, CdS, ZnO, ZnTe, ZnCdTe, CuInSe, CuSe, and InGaAs. Optionally, a combination of materials may comprise the plasmonic nanostructures 605. For example, but not to serve as a limitation, a plasmonic nanostructure may be comprised of a metal core surrounded by an insulator shell. Optionally, the size of the plasmonic nanostructures 605 may vary or be uniform.

When the plasmonic nanostructures 605 are exposed to radiation 600, a heavy electric field 620 is generated between the plasmonic nanostructures on a nanoscale level which may be used to enhance the drift current of the junction and increases the efficiency of the harvester by reducing electron-hole recombination. Optionally, while the pattern shown is comprised of a column, other configurations may be used with plasmonic nanostructures in a similar arrangement to generate an electric field 620 across the junctions to enhance the junction's drift current.

Figure 6B:
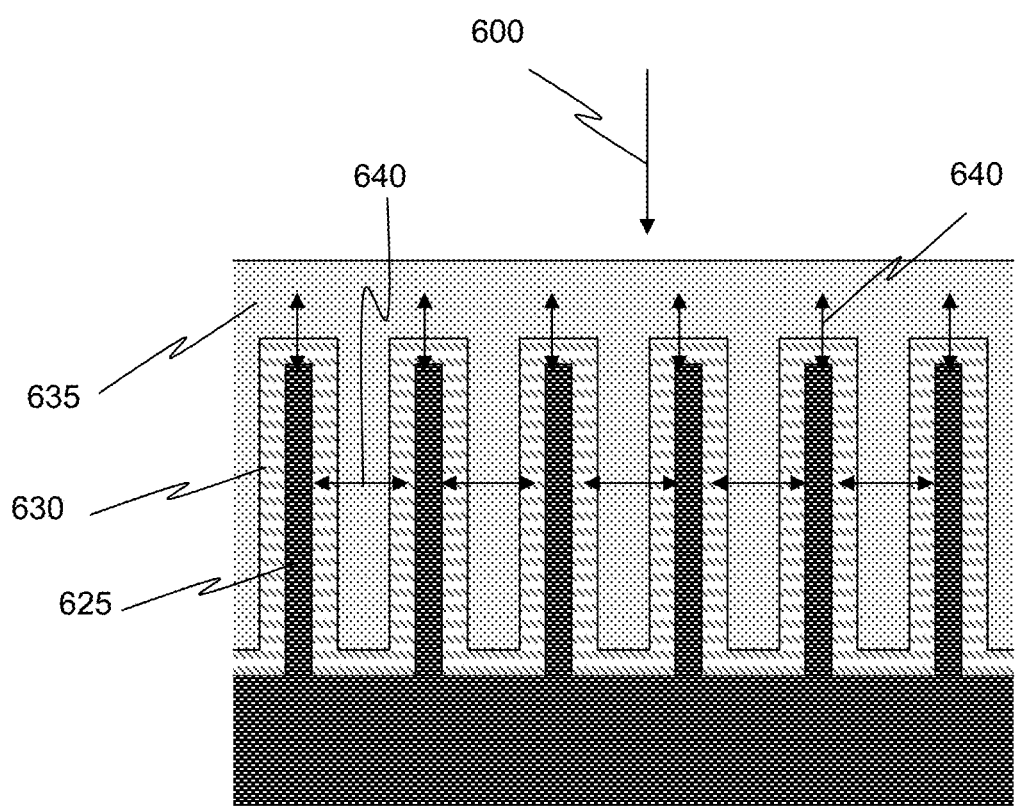

FIG. 6B illustrates an alternate embodiment for a junction incorporating plasmonic nanostructures. Plasmonic nanostructures 625 may be comprised of nanoparticles, nanowires, nanodots, nanorods, nanotubes, nanocones, branched nanostructures, nanobipods, nanotripods, nanotetrapods, quantum dots, nanopillars, H shaped structures, cavity structures, crescent structures, chiral or asymmetric structures, or other structural configurations or a combination of the aforementioned. The structures 625 may be comprised of semiconductors, dielectrics, ferroelectrics, insulator, or metal are arranged on a substrate or buffer layer in very close proximity. The structures 625 may be comprised of the same material as the substrate or a different material. Optionally, the structures 625 may be oriented in a normal or near normal position relative to the surface of the substrate. A first semiconductor material 630 conforms to the structures 625 and may be doped either p-type or n-type. A second semiconductor material 635 conforms to the first material 630 and is doped either n-type or p-type such that the first and second material form a p-n junction. Optionally, an intrinsic material, not shown, may be included between the p-type and n-type materials to form a p-i-n junction. In the presence of radiation 600, the plasmonic structures 625 generate a heavy electric field 640 across the junction, enhance the drift current and reducing recombination.

Figure 6C:
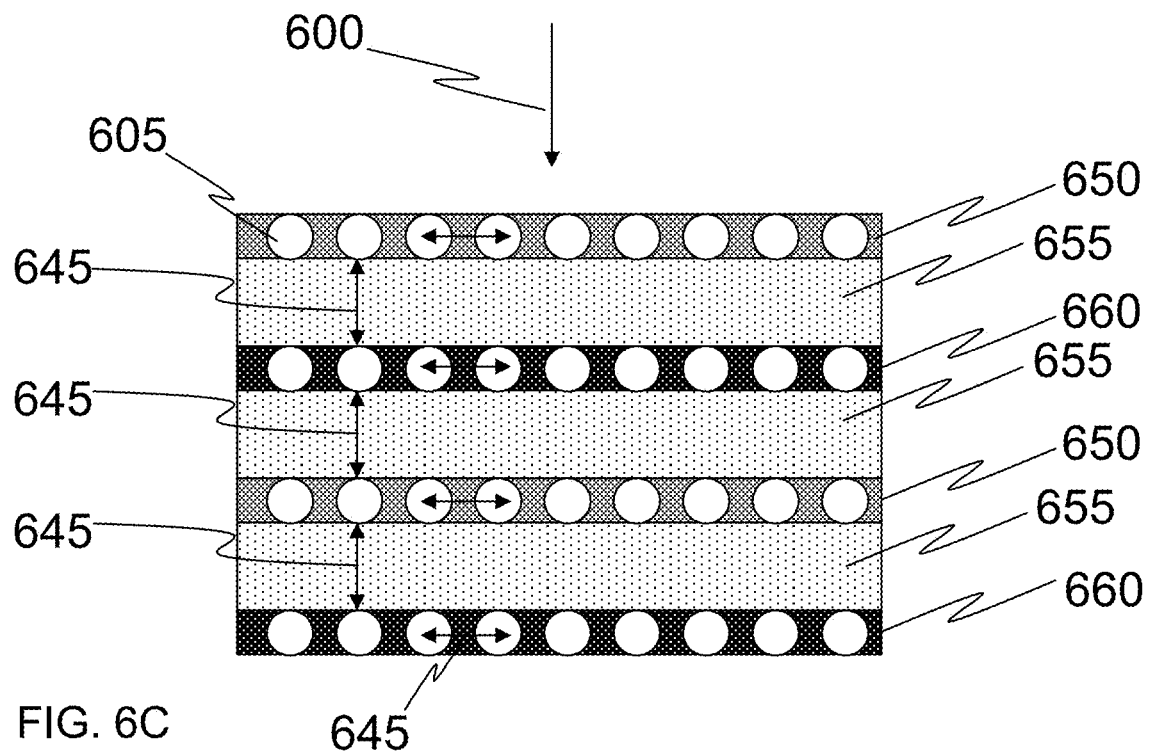
Figure 6D:
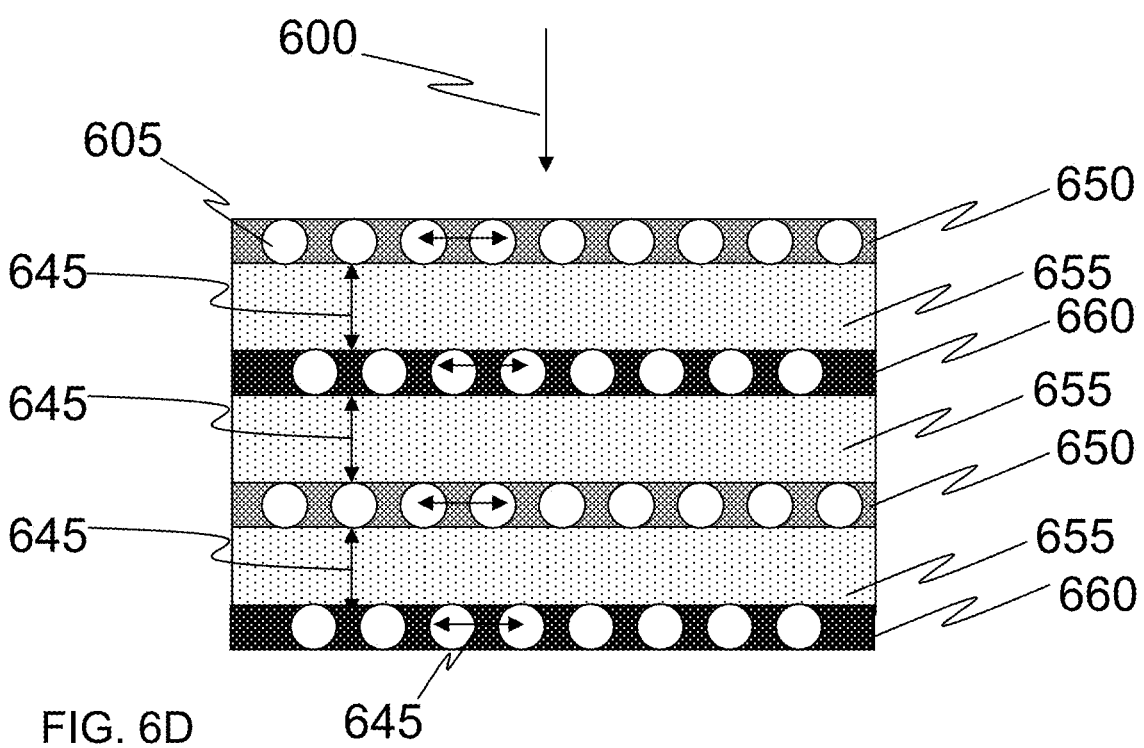

FIG. 6C depicts an embodiment of an absorption layer 117 with planar junctions incorporating plasmonic nanostructures. A first material 650 is doped either p-type or n-type. A second adjacent material 660 is doped, either n-type or p-type, to be the opposite type of the first absorption layer 650, creating a p-n junction. Plasmonic nanostructures 605 are embedded with uniform spacing within both materials 650 and 660, creating plasmonic layers. Optionally, an intrinsic material 655 may be included between the first and second materials 650 and 660 to create p-i-n junctions. In the presence of radiation, a heavy electric field 645 is generated between the plasmonic nanostructures and across the intrinsic material 655. Alternatively, the plasmonic nanostructures may be non-aligned, as shown in FIG. 6D. The plasmonic nanostructures may be of a fixed distance, d, from each other, as illustrated in FIGS. 6C and 6D. Optionally, additional semiconductor materials may be added accordingly to create multiple junctions 325.

Figure 6E:
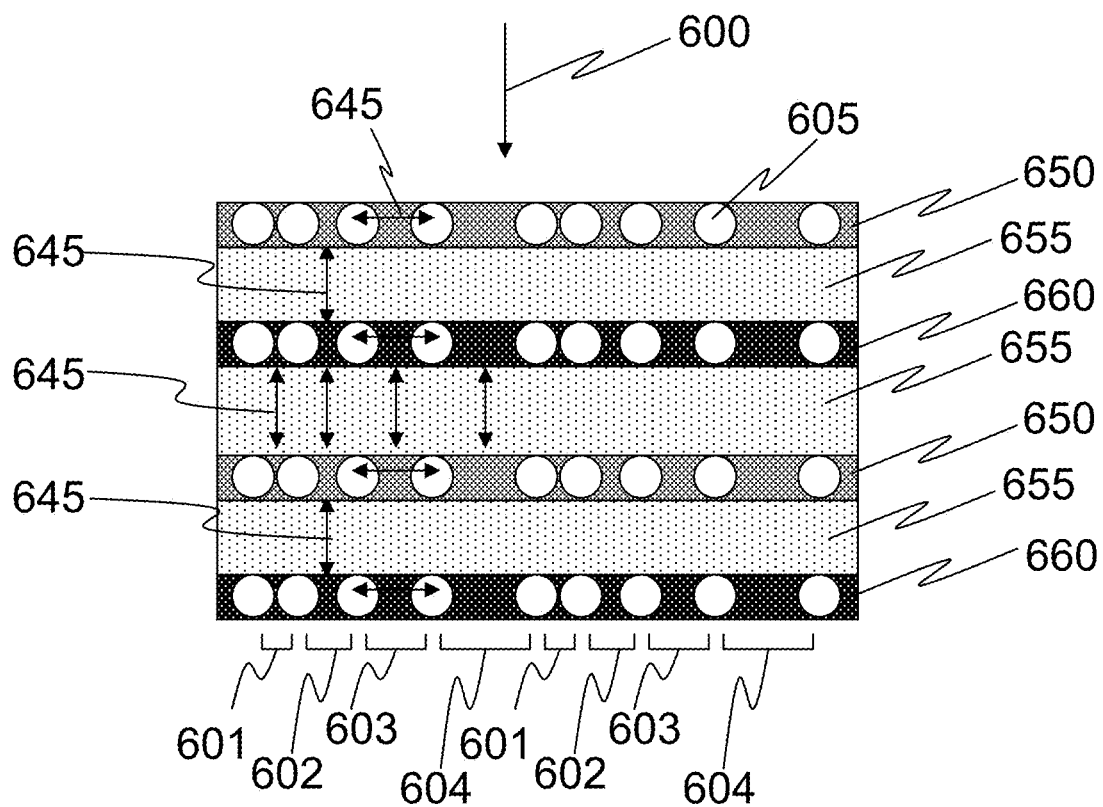

Optionally, the distance between the plasmonic nanostructures 605 comprising a layer within the materials may be varied. The distance may be increasing, decreasing, alternating (e.g. a long distance followed by a short distance), or randomized distances, etc. Optionally, a periodic pattern of distances may be used for arranging the plasmonic nanostructures 605. For example, but not in way of limitation, FIG. 6E illustrates plasmonic nanostructures 605 arranged in a periodic pattern of increasing distance. The pattern begins with plasmonic nanostructures 605 separated by a distance $d_1$ 601, followed by a separation a distance $d_2$ 602, the following separation may be a distance $d_3$ 603, and subsequent separations may continue until $d_n$ 604. The arrangement then repeats from $d_1$ 601. Alternatively, the pattern may initially increase the distance between the plasmonic nanostructures from $d_1$ to $d_d$ and then decrease from $d_n$ to $d_1$. Optionally, the plasmonic nanostructures 605 comprising a layer may be comprised of different materials within the layer.

The periodic arrangements create an electric field with varying intensity within the junctions. In addition, the arrangements broaden the wavelength absorption spectrum or extend the cutoff wavelength of the junctions, allowing a wider spectrum of photons to be absorbed to generate power. Optionally, the periodic arrangements may be used as a filter to allow specific ranges of wavelengths to pass through the layer of plasmonic nanostructures.

Figure 6F:
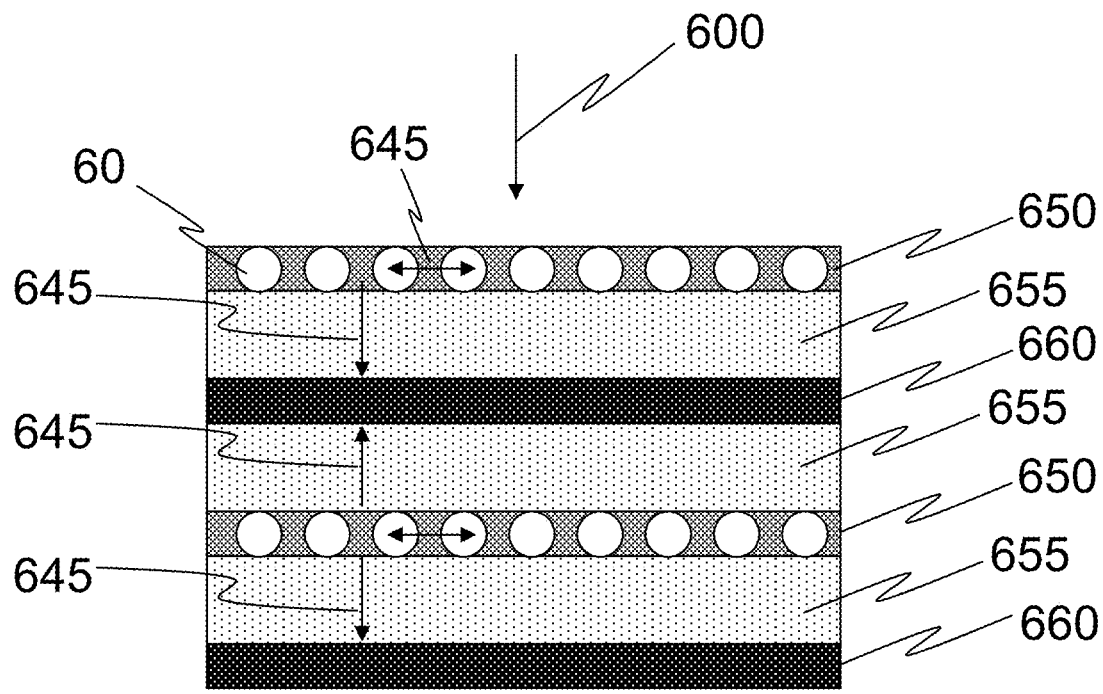

Optionally, the plasmonic nanostructures 605 may not be embedded in every p-type and n-type material. FIG. 6F illustrates an alternate embodiment where plasmonic nanostructures 605 are embedded in alternating materials.

Figure 6G:
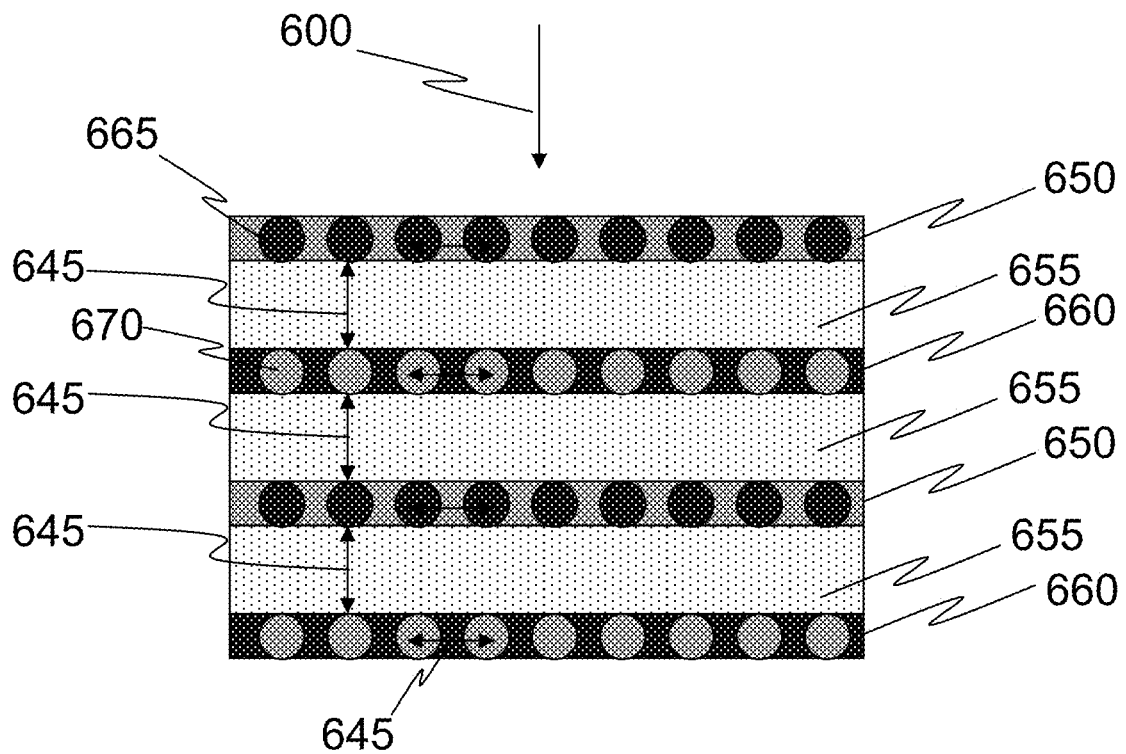

FIG. 6G illustrates an alternate embodiment of junctions incorporating embedded plasmonic nanostructures. The doped semiconductor materials 650 and 660 and the intrinsic material 655 are as described above in FIG. 6C. This embodiment comprises two sets of plasmonic nanostructures 665 and 670. The plasmonic nanostructures 665 and 670 may be comprised of nanoparticles, nanowires, nanodots, nanorods, nanotubes, nanocones, branched nanostructures, nanobipods, nanotripods, nanotetrapods, quantum dots, nanopillars, H shaped structures, cavity structures, crescent structures, chiral or asymmetric structures, or other structural configurations or a combination of the aforementioned. Optionally, the plasmonic nanostructures 665 and 670 may be solid or hollow, allowing for a core-shell configuration, with single or multiple shell layers. The plasmonic nanostructures 665 and 670 are comprised of any type of semiconductor. The embedded plasmonic nanostructures 665 and 670 may be comprised of the same or different material than the absorption layers 650 and 660. For example, but not to be construed as a limitation, if the absorption layer is InP, the plasmonic nanostructures may be comprised of InP or comprised of a different semiconductor material.

The plasmonic nanostructures are doped to be the opposing type, either p-type or n-type, from the material in which the plasmonic nanostructures are embedded. For example, but not to serve as a limitation, if a material 650 is doped to be p-type, the plasmonic nanostructures 665 are doped to be n-type, creating p-n junctions between the plasmonic nanostructures 665 and the material 650. Likewise, if a material 660 is n-type, then the plasmonic nanostructures 670 are doped to be p-type. The first set of plasmonic nanostructures 665 are electrically connected to a common electrode, not shown, and the second set of plasmonic nanostructures 670 are electrically connected another common electrode, not shown. This structure allows power to be generated from the p-n junctions formed between the plasmonic nanostructures and the semiconductor material in which they are embedded. Optionally, the plasmonic nanostructures may be configured according to the various configurations described above in FIGS. 6C-F.

Figure 6H:
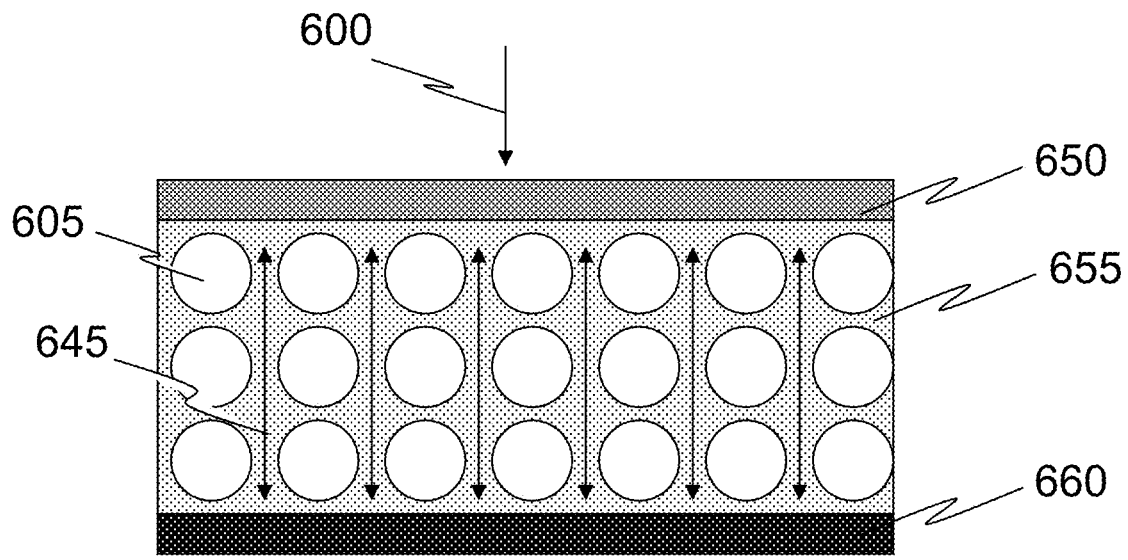

FIG. 6H illustrates an alternate embodiment for the configuration of a p-i-n junction incorporating plasmonic nanostructures in the intrinsic material. At least one layer of plasmonic nanostructures 605 may be embedded within the intrinsic material 655. Optionally, the plasmonic nanostructures 605 may be intrinsically doped to match the intrinsic material 655. The embedded plasmonic nanostructures 605 may be uniformly or non-uniformly arranged or spaced. Optionally, a periodic plasmonic nanostructures configuration, similar to that described above in FIG. 6E, may be used.

Figure 6I:
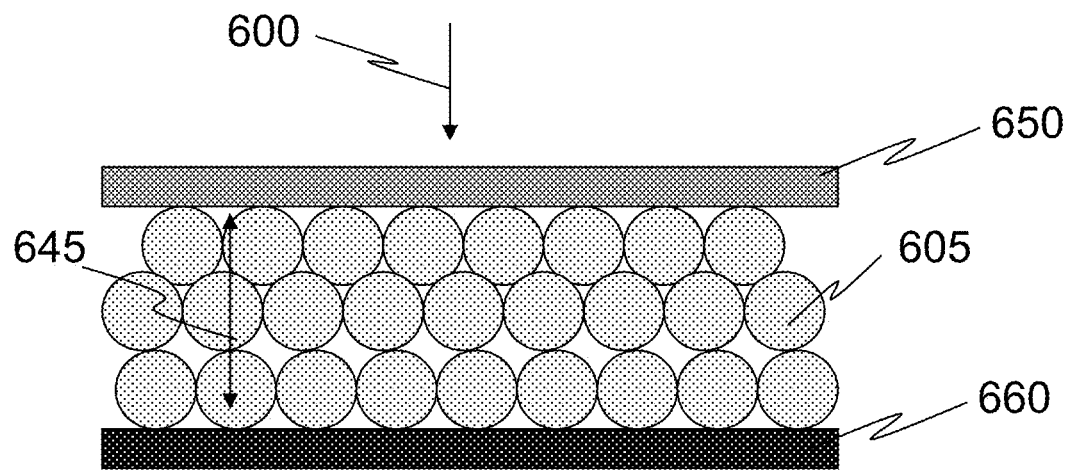

Alternatively, the plasmonic nanostructures may comprise the entirety of the intrinsic material, as shown in FIG. 6I. In this embodiment, the plasmonic nanostructures 605 are comprised of any type of semiconductor. The plasmonic nanostructures are intrinsically doped to serve as the intrinsic material for the p-i-n junction. The plasmonic nanostructures may be uniformly or non-uniformly arranged. The plasmonic nanostructures in both the embedded and non-embedded configurations generate a heavy electric field across the intrinsic layer, enhancing the drift current of the junction.

Figure 6J:
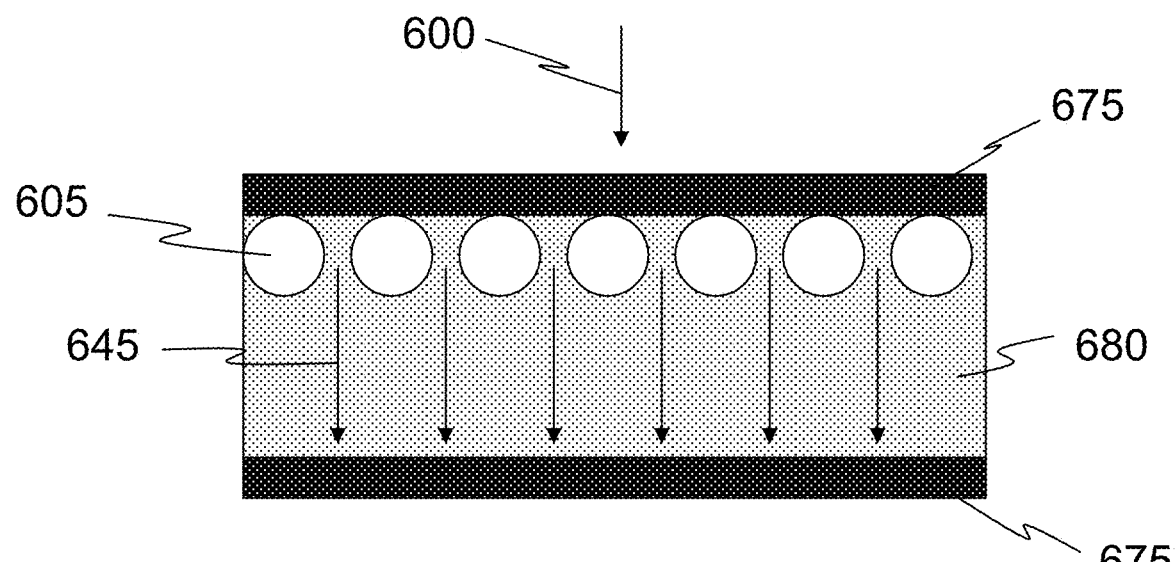

FIG. 6J depicts an embodiment for incorporating plasmonic nanostructures in a photoconductor. The semiconductor materials 675 are doped either p-type or n-type. An intrinsic material 680 is very lightly doped to be the same type as the materials 675, e.g. either $n^-$ or $p^-$, creating a p-i-p or n-i-n junction. At least one layer of plasmonic nanostructures 605 is embedded within the intrinsic layer 680. Optionally, the plasmonic nanostructures may be doped to match the intrinsic material.

FIG. 7 illustrates alternative embodiments of the absorption layer incorporating plasmonic nanostructures. While these embodiments are drawn to the thermal harvester portion of the device, similar configurations may be used in the solar harvester. The plasmonic nanostructures 710 may be comprised of nanoparticles, nanowires, nanodots, nanorods, nanotubes, nanocones, branched nanostructures, nanobipods, nanotripods, nanotetrapods, quantum dots, nanopillars, H shaped structures, cavity structures, crescent structures, chiral or asymmetric structures, or other structural configurations or a combination of the aforementioned. Optionally, the plasmonic nanostructures 710 may be solid or hollow, allowing for core-shell configurations with single or multiple shell layers. Optionally, the plasmonic nanostructures may comprise a coating. For example, a ferroelectric core with a silver coating. Optionally the size of the plasmonic nanostructures 710 may vary or be uniform. The material comprising the plasmonic nanostructures 710 may be any type of semiconductor, metal, dielectric, insulator, or ferroelectric material. Optionally, the material comprising the plasmonic nanostructures 710 may be a combination of the aforementioned materials. In FIG. 7A-E, the absorption layer 117 is disposed between a top electrode 705 and a bottom electrode 730. FIG. 7A illustrates one embodiment where a layer of plasmonic nanostructures 710 in a periodic pattern is embedded within the top electrode 705. Alternatively, the plasmonic nanostructures 710 may be located above the top electrode 705, as shown in FIG. 7B. Optionally, depicted in FIG. 7C, another embodiment may embed the layer of plasmonic nanostructures 710 within the absorption layer 117, just below the electrode 705. FIG. 7D illustrates another configuration where the plasmonic nanostructures 710 may be embedded within the absorption layer 117 just above the junction. Yet another embodiment may arrange the plasmonic nanostructures 710 on the surface of the absorption layer 117, with a very thin electrode 705 covering the plasmonic nanostructures 710, as shown in FIG. 7E. Other configurations of the plasmonic layer may be used to filter the radiation 700 and generate a heavy electric field to enhance the drift current across the junction.

FIG. 7F-H illustrates alternate configurations of plasmonic nanostructures on the surface of the absorption layer 117. In these embodiments the plasmonic nanostructures are comprised of metal nanostrips which serve as the electrode 705. FIG. 7F illustrates an embodiment of the nanostrips on the top surface of the absorption layer. The nanostrips may be connected to serve as the electrode 705. Optionally the strips may comprise a coating, e.g. silver. FIG. 7F:AA' illustrates a cross section of the embodiment in FIG. 7F, where the spacing of the plasmonic nanostrips serve to filter and intensify the amplitude of the radiation 700, allowing photons with the desired wavelength ranges to pass through to the absorption layer 117. Additionally, the close proximity of the plasmonic strips generates a heavy electric field to enhance the drift current across the junction which increases the efficiency of the energy harvester by reducing electron-hole recombination. FIG. 7G illustrates an alternate embodiment of plasmonic nanostrips comprising the electrode 705 in a crosshatch pattern. Alternatively, the plasmonic nanostrips comprising the electrode 705 may be arranged in a zig-zag pattern, as shown in FIG. 7H.

Optionally, alternate configurations may be used where the plasmonic nanostrips comprise arrangements resulting in triangular, rectangular, hexagonal, octagonal or other repeating polygonal patterns. Optionally, alternate configurations of plasmonic nanostrips may include patterns comprising concentric ovals, circles, semicircles, rectangles, squares, or other polygons, not shown. Optionally, the plasmonic nanostrips may be arranged in spiral patterns comprising of circular, oval, rectangular, or other polygonal spirals, not shown. These patterns result in similar cross sections as in FIG. 7F:AA' where the spacing between the plasmonic nanostrips filter and intensify the amplitude of the radiation 700 and generate a heavy electric field to enhance the drift current across the junction.

Figure 7A:
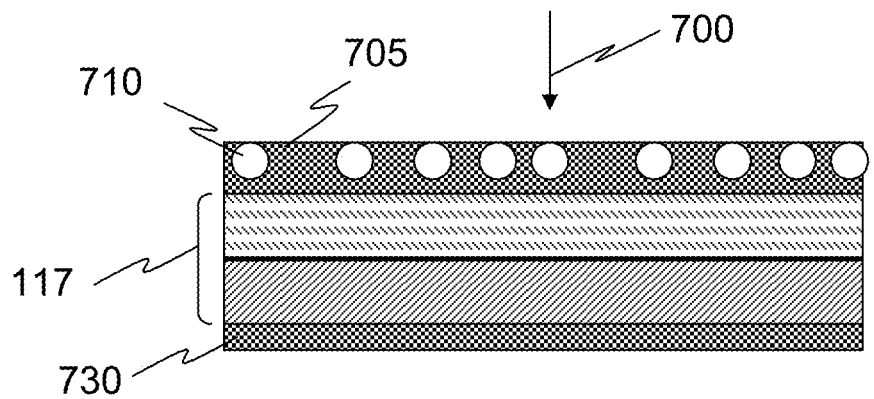
Figure 7B:
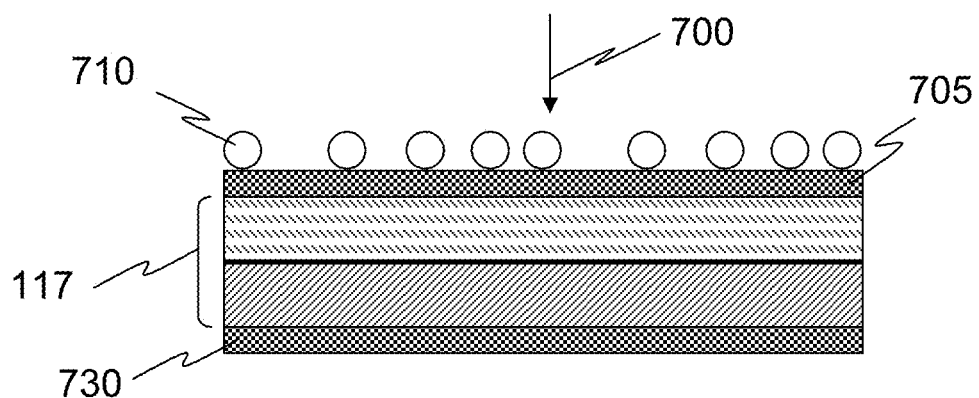
Figure 7C:
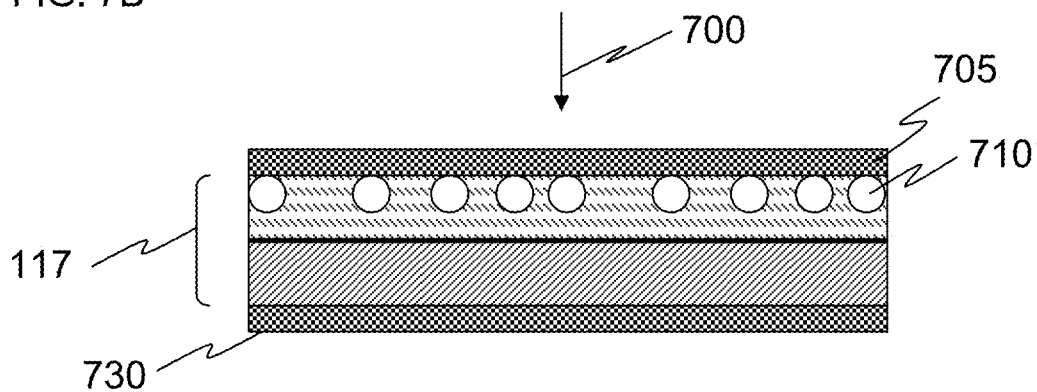
Figure 7D:
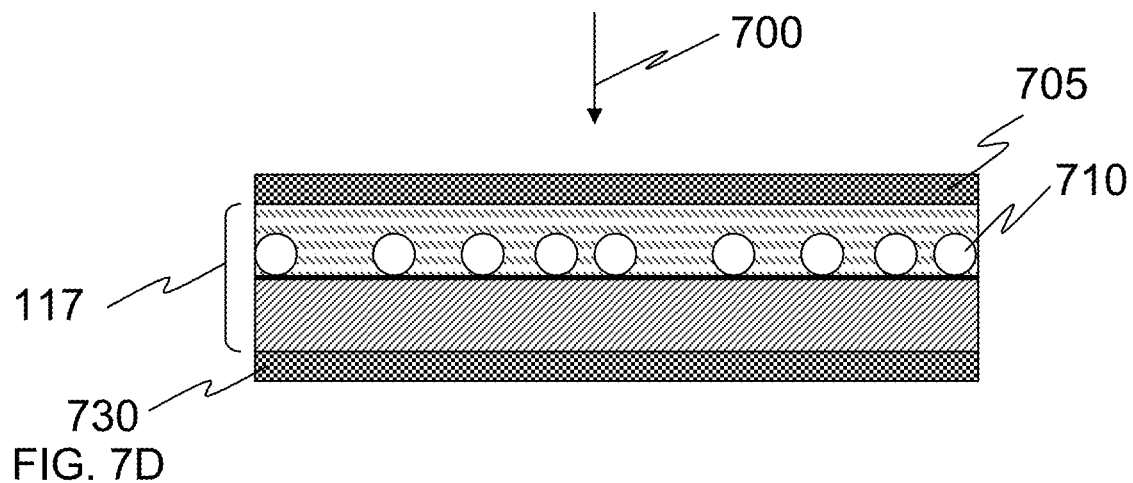
Figure 7E:
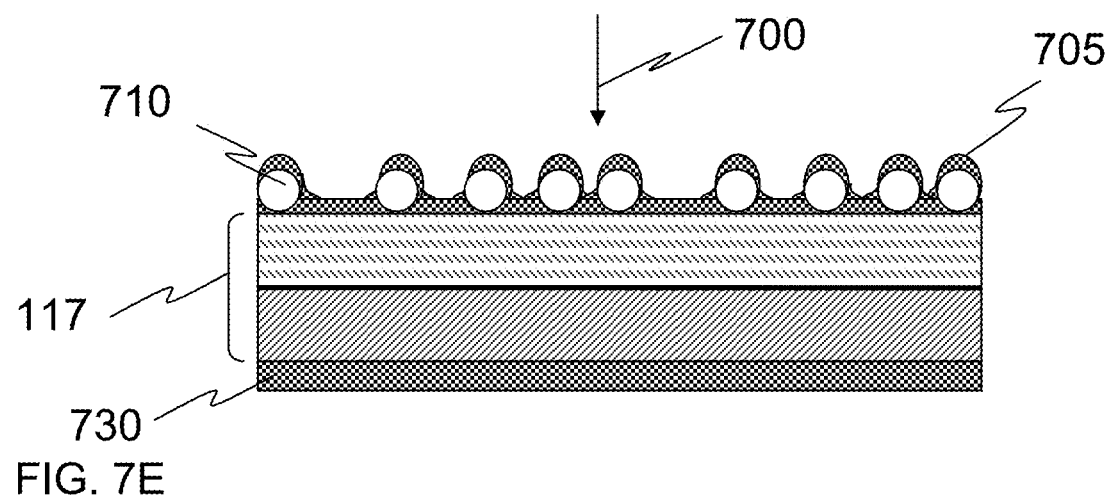
Figure 7I:
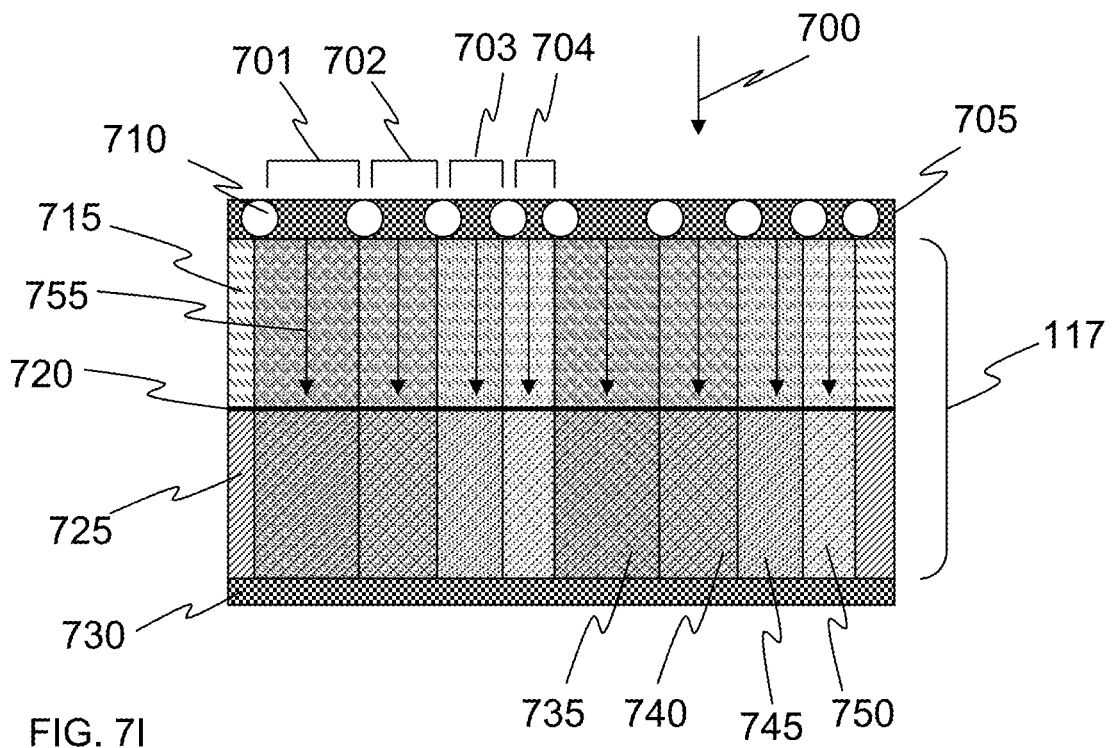

FIG. 7I illustrates a cross-section of an absorption layer comprising multiple materials incorporating plasmonic nanostructures. The absorption layer 117 is disposed and electrically connected to a first electrode 705 and a second electrode 730. While the electrodes are shown as planar layers, other shapes of electrodes may be used that are electrically connected to the absorption layer to carry a current. Alternatively, in the case the plasmonic nanostructures 710 are comprised of metal and connected to a common electrode, the plasmonic nanostructures may serve as the first electrode 705.

The plasmonic nanostructures 710 may be arranged as described above in FIG. 7A-H. The distance between the plasmonic nanostructures 710 may be adjusted to allow photons with a desired wavelength range to pass through to reach a junction 720. For example, but not to serve as a limitation, a first distance, $d_1$, 701 between the plasmonic nanostructures may allow a photons with range $\lambda_1$, a second distance, $d_2$, 702 may allow photons with the range $\lambda_2$, a third distance, $d_3$, 703 may allow photons within a range $\lambda_3$, a fourth distance, $d_4$, 704, may allow photons within the range $\lambda_4$.

The semiconductor material located beneath the space between each plasmonic is designed with a specific cutoff wavelength corresponding to the wavelengths of the photons allowed to pass through, enabling the junction 720 all or nearly all of the photons that pass the plasmonic nanostructures. For example, but not to serve as a limitation, in a device with a periodic pattern of four distances, a first distance, $d_1$, 701, may allow photons with wavelengths of $\lambda_1$ to reach the junction 720. The corresponding section of the absorption layer 117 may be comprised of a material 735 which is designed with a cutoff wavelength comprising $\lambda_1$. The second distance, $d_2$, 702, may allow photons within the wavelength range $\lambda_2$, the semiconductor material 740 is designed with a cutoff wavelength comprising $\lambda_2$. The third distance, $d_3$, 703, allowing photons with the range $\lambda_3$ would correspond with the material with a cutoff wavelength of $\lambda_3$ 745. The fourth distance, $d_4$, 704, allowing photons with the range $\lambda_4$, corresponds to the material with a cutoff wavelength $\lambda_4$ 750.

The upper and lower portions of the material comprising the absorption layer 117 are doped to be opposite types, creating a p-n junction 720. For example, but not to serve as a limitation, the upper portion 715 of the absorption layer 117 may be doped n-type and the lower portion 725 would be doped p-type. Optionally, an intrinsic section may be included, not shown, creating a p-i-n junction. The close proximity of the plasmonic nanostructures creates a heavy electric field 755 through the absorption layer 117 which is used to enhance the drift current of the junction 720. While the figure illustrates a periodic pattern of four distances, any number of distances may be used.

Figure 7J:
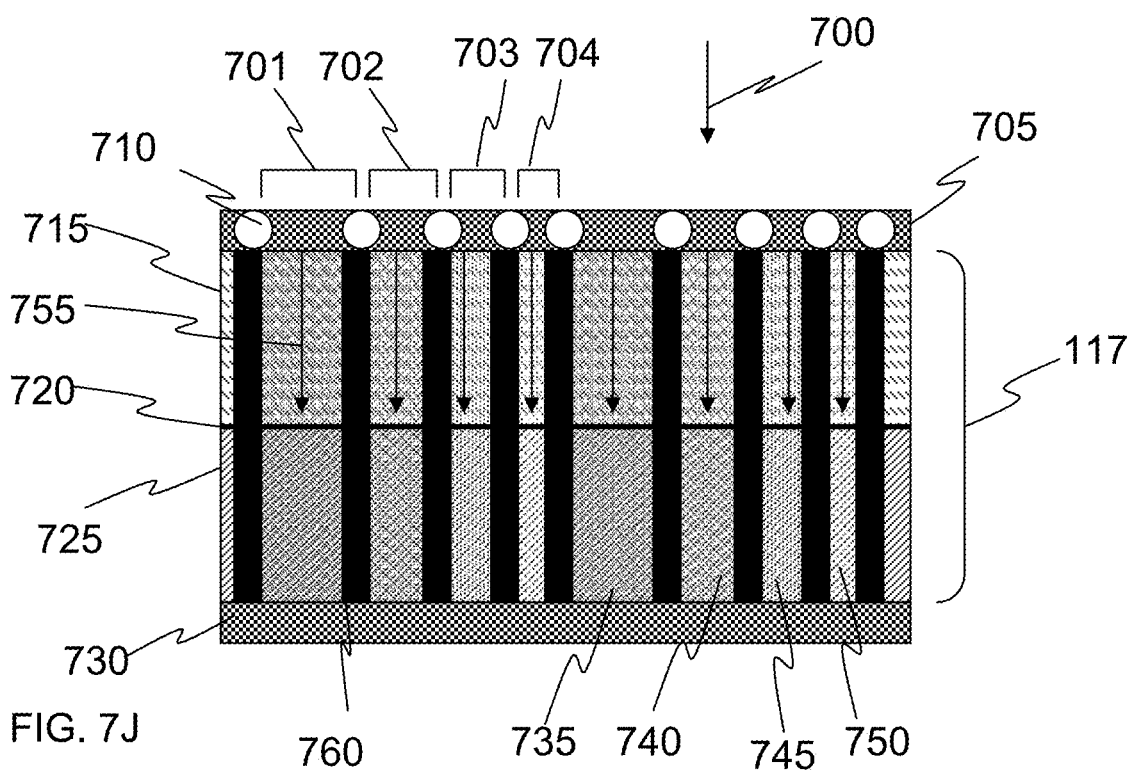

FIG. 7J illustrates an optional embodiment incorporating insulators. The insulators 760 may be comprised of dielectrics, ferroelectrics, metals, or semiconductors of a different material than the material comprising the absorption layer 117. The insulators 760 are located beneath the plasmonic nanostructures 710 and separate the vertical sections of different material comprising the absorption layer. The insulators 760 may extend part way through the absorption layer 117, stopping before the junction 720, reaching the junction 720, or extending past the junction 720. Optionally, the insulators may extend entirely through the absorption layer 117. In this optional embodiment where the insulators 760 extend the entire width through the absorption layer 117, metals may not be used for the insulators 760 otherwise a short circuit will occur.

Figure 7K:
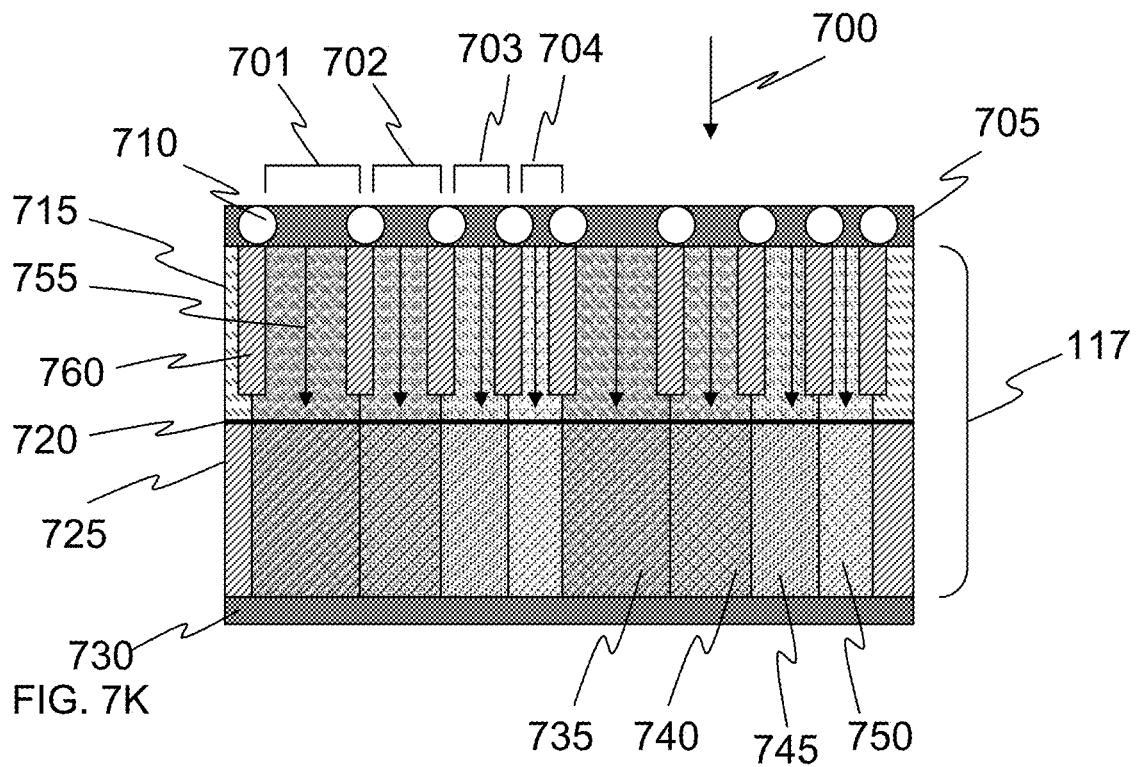

FIG. 7K illustrates an alternate embodiment of the absorption layer incorporating plasmonic nanostructures and insulators. In this embodiment the insulator 760 extends part way through the absorption layer 117, stopping prior to the junction 720. The insulator is comprised of a semiconductor material doped the opposite type from the top portion 715 of the absorption layer 117, creating p-n junctions between the insulator 760 and the absorption layer 117. The insulator 760 is electrically connected to an electrode, not shown. The additional p-n junctions in this embodiment allow for more power to be generated by the harvester.

Figure 7L:
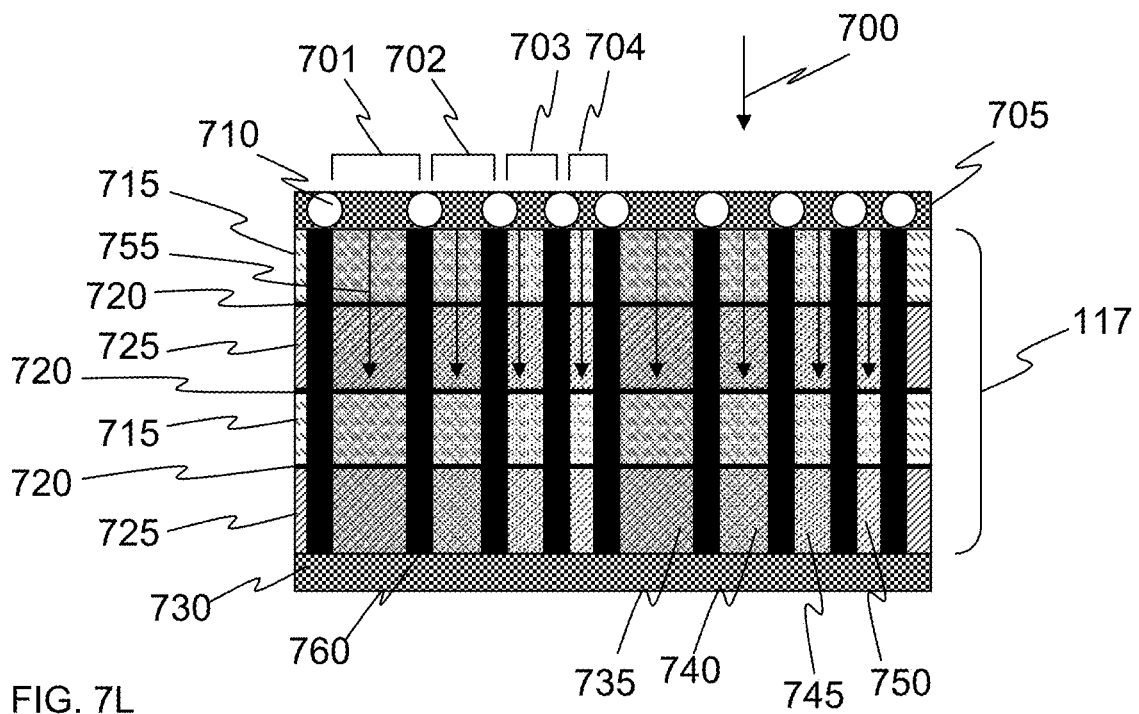

FIG. 7L illustrates an alternate embodiment of the absorption layer incorporating plasmonic nanostructures. In this embodiment, the absorption layer comprises multiple p-n junctions 720. These junctions may be formed by alternating p-type and n-type materials to form the junctions. Optionally, intrinsic material may be included between the p-type and n-type junctions to form p-i-n junctions. While the figure illustrates three junctions, any number of junctions may be used. The absorption layer 117 is comprised of material as described in FIG. 7I. Optionally, the plasmonic nanostructures may be arranged according to the configurations in FIG. 7A-H. Optionally, insulators as described in FIG. 7J-K may be used.

FIG. 8A-J depicts an embodiment of a process to produce a monolithic perpetual energy harvester. This embodiment develops the perpetual energy harvester on a common substrate. The electrodes in this process are not shown, but are configured as described in FIG. 1. FIG. 8A illustrates the beginning of the process with a substrate 800, which may be comprised of group IV semiconductors, group III-V semiconductor compounds, group II-VI semiconductor compounds, SOI, or metal. Group IV semiconductors are not limited to but may include Si, polysilicon, SiC, Ge, or SiGe alloy. Group III-V semiconductors are not limited to but may include AlN, GaAs, GaN, InP, GaSb, or InSb. Group II-VI semiconductors are not limited to but may include CdZnTe, HgCdTe, HgZnTe, ZnO, ZnS, CdS, or CdTe. The substrate 800 is then subject to an oxidization process, creating an oxidized layer 805 on the top and the bottom surface of the substrate 800, as shown in FIG. 8B.

One surface of the substrate 800 is used to create the solar harvester. FIG. 8C depicts an optional step of creating grooves 810 or a pattern on one surface of the energy harvester to serve as an antireflective surface. The grooves 810 or pattern may be created through an etching or photolithographic process. Alternatively, the pattern or grooves 810 may be created by depositing, growing, or attaching material that contains the pattern or groove 810. In FIG. 8D, the oxide on the optionally etched surface is removed. One or more p-n or p-i-n junctions 815 designed to absorb radiation in the visible spectrum are created using traditional semiconductor doping techniques, as shown in FIG. 8E.

Alternatively, a separate embodiment, not shown, may utilize a thin-film solar harvester. The thin-film solar harvester may be comprised amorphous silicon, polysilicon, crystalline silicon, Ge, SiGe, CdTe, ZnO, CdZnTe, HgCdTe, HgZnTe, GaAs, GaN, InP, GaSb, InSb. Traditional chemical vapor deposition techniques or spin coating techniques may be used to create the thin-film solar harvester on the substrate 800.

Yet another embodiment may utilize a multi-junction solar harvester, not shown. The multi-junction solar harvester may be comprised of multiple thin films generated by molecular beam epitaxy or vapor phase epitaxy. The films are generated such that the films which have a shorter cutoff wavelength are on top of the films that have a longer cutoff wavelength.

FIG. 8F illustrates the application of an optional antireflective coating 820 to aid in focusing or directing radiation. Alternatively, an oxide layer may be used instead of an antireflective coating 820.

FIG. 8G depicts the removal of the oxide layer 805 from the surface opposite the solar harvester. An optional buffer layer 825 may be attached to the substrate 800. The buffer layer may be comprised of group IV semiconductors, group III-V semiconductors, or group II-VI semiconductors. Group IV semiconductors are not limited to but may include Si, polysilicon, SiC, Ge, or SiGe alloy. Group III-V semiconductors are not limited to but may include AlN, GaAs, GaN, InP, GaSb, or InSb. Group II-VI semiconductors are not limited to but may include CdZnTe, HgCdTe, HgZnTe, ZnO, ZnS, CdS, or CdTe.

Optionally, the buffer layer 820 may be a similar material system or a dissimilar material system from the substrate 800. In both material systems, the buffer layer is doped to be the same type as the substrate 800. The buffer layer 820 may be epitaxially grown on, deposited, or wafer bonded to the substrate 800.

An absorption layer 830, comprising at least one junction, is created either directly on the substrate 800 or on the buffer layer 825. The absorption layer 830 may be comprised of p-n or p-i-n junctions. The absorption layer 830 may be created by growing a semiconductor material 835, which may be doped either p-type or n-type. A second semiconductor material 845 may be grown on and doped to be the opposing type of the first semiconductor material 835 to create a p-n junction. Optionally, an intrinsic material 840 may be included between the p-type and n-type semiconductor compound layers to create a p-i-n junction. The growth of the materials may be accomplished through various techniques such as Molecular Beam Epitaxy (MBE), vapor phase epitaxy (VPE), liquid-phase epitaxy (LPE), etal-organic chemical vapor deposition (MO-CVD), or other chemical vapor deposition techniques. Alternatively, a p-type or n-type semiconductor material 835 may be grown and the top portion may be doped to the opposite type creating the second semiconductor material 845.

Optionally, to create multiple junctions, additional semiconductor materials may be added. FIG. 8G illustrates a third semiconductor material 850 which is doped to be the opposite type of 845. Optionally, an intrinsic material 840 may be included between the second and third semiconductor compound layers to create a p-i-n junction. The semiconductor materials 835, 845, 850 and intrinsic material 840 may be comprised of HgCdTe, HgZnTe, InSb, InAs, GaSb, GaAs, or PbTe. Optionally, each individual junction may be comprised of a different material.

The junctions within the absorption layer 830 are contemplated to be homo-junctions comprised of a single material. Optionally, hetero-junctions may be used. For example, but not to serve as a limitation, in a two junction thermal harvester comprised of three materials, the first material may be comprised of HgCdTe and doped to be p-type, the second material may be comprised of InSb and doped n-type, and the third material may be comprised of PbTe and doped p-type. While FIG. 8G depicts an absorption layer 830 with two junctions, any number of junctions can be created using this process. The absorption layer 830 may be arranged in a variety of configurations as illustrated in FIGS. 4, 5, 6, and 7.

FIG. 8H illustrates an optional step to create trap structures 855 within the absorption layer 830 through an etching process, such as photolithography, to create the desired shape and configuration of the trap structures. While the trap structures 855 depicted in the process are columns, other shapes or configurations may be used which reflect the radiation until it is absorbed by a junction.

Optionally the etched trap structures 855 may be filled with a material that is transparent to the wavelength of radiation desired to be trapped 860, as shown in FIG. 8I. Optionally, the etched trap structures may comprise nanostructures, not shown, to enhance the reflection, refraction, and scattering of the trap structures 855. Filling the trap structures with transparent material and the nanostructures may be accomplished through spin coating, MBE, VPE, LPE, MO-CVD, other chemical vapor deposition, or printing or ink-jettable techniques. The material 860 is then planarized to be level with absorption layer. FIG. 8J shows the addition of an insulator layer 865 over the junctions 855. Alternatively, air may be used for the etched trap structures, not shown, resulting in gaps in the insulator layer 865 between the columns.

Figure 9A:
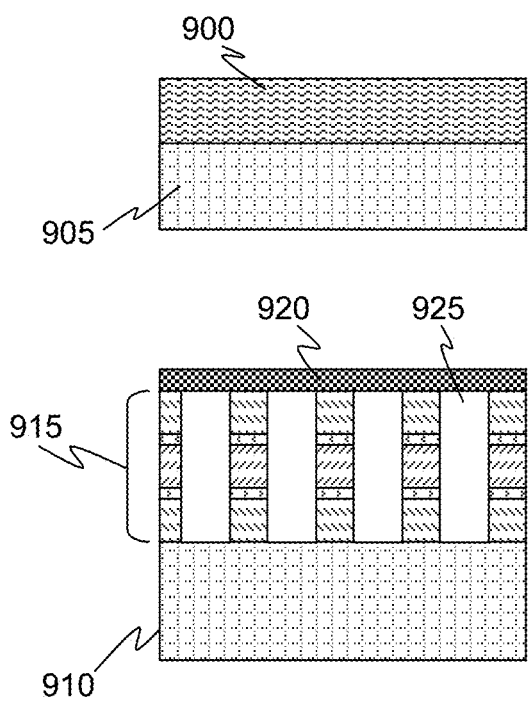
FIGS. 9A and 9B depicts an alternative method for manufacturing a monolithic perpetual energy harvester.
Figure 9B:
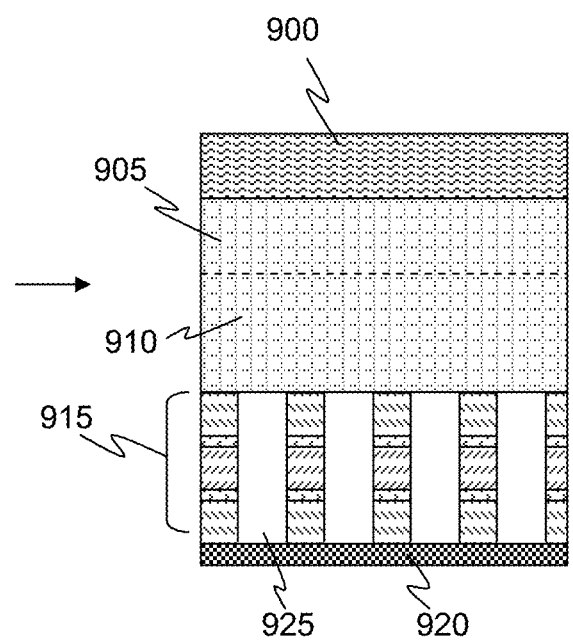

FIG. 9 depicts an alternative embodiment for a method of producing a monolithic perpetual energy harvester. This method creates a perpetual energy harvester from a solar harvester and a thermal harvester manufactured on individual substrates. A solar harvester 900 is manufactured on a separate substrate 905.

The solar harvester 900 may be comprised amorphous silicon, polysilicon, crystalline silicon, Ge, SiGe, CdTe, ZnO, CdZnTe, HgCdTe, HgZnTe, GaAs, GaN, InP, GaSb, or InSb. The substrate 905 may be comprised of group IV semiconductors, group III-V semiconductors, or group II-VI semiconductors, SOI, metal, insulators, dielectrics, or polymers. Group IV semiconductors are not limited to but may include Si, polysilicon, SiC, Ge, or SiGe alloy. Group III-V semiconductors are not limited to but may include AlN, GaAs, GaN, InP, GaSb, or InSb. Group II-VI semiconductors are not limited to but may include CdZnTe, HgCdTe, HgZnTe, ZnO, ZnS, CdS, or CdTe.

The thermal harvester in this embodiment is created on a separate substrate 910. The substrate 910 may be comprised of group IV semiconductors, group III-V semiconductors, or group II-VI semiconductors, SOI, or metal. The thermal harvester substrate 910 may, but is not required to be, the same material as the solar harvester substrate 905.

An optional buffer layer, not shown, may be attached to the substrate 910. The buffer layer may be comprised of group IV semiconductors, group III-V semiconductors, or group II-VI semiconductors. Group IV semiconductors are not limited to but may include Si, polysilicon, SiC, Ge, or SiGe alloy. Group III-V semiconductors are not limited to but may include AlN, GaAs, GaN, InP, GaSb, or InSb. Group II-VI semiconductors are not limited to but may include CdZnTe, HgCdTe, HgZnTe, ZnO, ZnS, CdS, or CdTe.

Optionally, the buffer layer may be a similar material system or a dissimilar material system from the substrate 910. In both material systems, the buffer layer is doped to be the same type as the substrate 910. The buffer layer may be epitaxially grown on, deposited, or wafer bonded to the substrate 910.

An absorption layer comprising 915 single or multiple junctions are grown on the substrate 910 or the buffer layer, not shown. Each junction 915 is comprised of a p-n or p-i-n junction. The junctions 915 may be grown in a variety of configurations as illustrated in FIGS. 4, 5, 6, and 7.

The growth of the layers may be accomplished through various techniques such as Molecular Beam Epitaxy (MBE), vapor phase epitaxy (VPE), liquid-phase epitaxy (LPE), metal-organic chemical vapor deposition (MO-CVD), or other chemical vapor deposition techniques. The absorption layer 915 may be comprised of HgCdTe, HgZnTe, InSb, InAs, GaSb, GaAs, InP, or PbTe.

Optionally, trap structures 925 may be created within the absorption layer 915 through an additional etching process, such as photolithography, to create the desired shape and configuration of the trap structures. Optionally the etched trap structures 925 may be filled with a material that is transparent to the wavelength of radiation desired to be trapped. Optionally, the etched trap structures may comprise nanostructures, not shown, to enhance the reflection, refraction, and scattering of the trap structures 925. Filling the trap structures with transparent material and the nanostructures may be accomplished through spin coating, MBE, VPE, LPE, MO-CVD, other chemical vapor deposition, or printing or ink-jettable techniques. While the trap structures 925 are depicted as columns, other shapes and configurations may be used. An insulator layer 920 is then created over the junctions 915. Alternatively, the trap structures 925 may be filled with air resulting in gaps in the insulator layer 920 between the columns, not shown.

The bottom surface of the solar harvester substrate 900 is then bonded to the bottom surface of the thermal harvester substrate 910. This bonding may be accomplished though traditional wafer bonding methods or using optically transparent epoxy.

According to this invention the substrate or the layer of material may be comprised of any semiconductor such as Si, Ge, InP, GaAs, GaN, ZnS, CdTe, CdS, ZnCdTe, HgCdTe, AlN, SiC, etc. Optionally, the substrate may be comprised of any polymers or ceramics such as AlN, Silicon-oxide, etc. This invention also contemplates dye-synthesized/sensitized harvesters comprising an electrolyte layer wherein the electrolyte and electrodes comprising the electrolyte layer absorbs energy existing in the radiation to create the electrical energy.

Alternately, the perpetual energy harvester may be comprised of semiconductor material systems and/or hybridized material systems (e.g. dye and electrolyte and semiconductor combination) and/or monolithically fabricated on the common substrate.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope.

The embodiments were chosen and described in order to explain the principles and applications of the invention, thereby allowing others skilled in the art to utilize the invention in its various embodiments and modifications according to the particular purpose contemplated. The scope of the invention is intended to be defined by the claims appended hereto and their equivalents.

The expected practical use of the present invention is the novel perpetual energy harvester which does not require a man-made energy source. The proposed invention may be used for fabricating wide spectrum energy harvesters to obtain the energy contained within all spectrum wavelengths, ranging from UV to far infrared wavelengths, and generate electrical energy.

What is claimed:

1. A perpetual energy harvester configured to harvest energy during day and/or night, comprising:
    a substrate formed from an insulator or an electrically conductive material, wherein the substrate has
        a first surface and a second surface;
    a first electrode;
    a second electrode;
    a solar harvester on the first surface of the substrate and electrically connected between the first and second electrodes, comprising
        at least one first p-n or p-i-n junction formed on or into the substrate, wherein the at least one first p-n or p-i-n junction comprising cutoff wavelengths between 0.3 μm to 2.5 μm;
    a buffer layer directly attached to the second surface of the substrate, wherein the buffer layer comprises a semiconductor material from a group consisting of CdZnTe, HgCdTe, HgZnTe, ZnS, CdS, CdTe, ZnSe, CdSe, GaSb, InAs, InSb, InAsSb, PbTe, PbS, PbSe, and combinations thereof;
    a third electrode;
    a fourth electrode; and
    a thermal harvester attached to the buffer layer and electrically connected between the third and fourth electrodes, comprising
        an absorption layer attached to the buffer layer, comprising
            a first material of p or n type layer; and
            a second material of n or p type layer,
            wherein the first and the second material layers forming at least one second p-n or p-i-n junction with an additional intrinsic or low doped material layer in between the first and second material layers and providing an open circuit voltage and the at least one second p-n or p-i-n junction comprising cutoff wavelengths between 2 μm to 40 μm, and
        wherein the fourth electrode electrically connects to the absorption layer comprising of the at least one second p-n or p-i-n junction and insulated from a conductive material that encircles the fourth electrode.

2. The perpetual energy harvester in claim 1, further comprising: a trap structure within the absorption layer, wherein the trap structure comprises a formation which reflects, refracts, or scatters photons within the formation until the photons are absorbed by two or more of the first p-n or p-i-n or the second p-n or p-i-n junctions.

3. The perpetual energy harvester in claim 1, further comprising: an antireflective coating on the surface of the solar harvester, wherein the antireflective coating comprises at least one planar and/or nanoscaled layer of material, whereby the antireflective coating directs radiation through the solar and thermal harvesters.

4. The perpetual energy harvester in claim 1, further comprising: a two or more second p-n or p-i-n junctions within the absorption layer arranged in a configuration of ascending cutoff wavelength from a direction of incoming radiation.

5. The perpetual energy harvester in claim 1, further comprising:
a reflective layer, and a three or more second p-n or p-i-n junction within the absorption layer is arranged in a configuration selected from the group consisting of a junction with the shortest cutoff wavelength located between junctions with longer cutoff wavelengths and/or a junction with the longest cutoff wavelength located between junctions with shorter cutoff wavelengths.

6. A perpetual energy harvester configured to harvest energy during day and/or night, comprising:
a substrate formed from an insulator or an electrically conductive material, wherein the substrate has
a first surface and a second surface;
a first electrode;
a second electrode;
a solar harvester on the first surface of the substrate and electrically connected between
the first and second electrodes, comprising
at least one first p-n or p-i-n junction formed on or into the substrate, wherein the at least one first p-n or p-i-n junction comprising cutoff wavelengths between 0.3 µm to 2.5 µm;
a buffer layer directly attached to the second surface of the substrate, wherein the buffer layer comprises a semiconductor material from a group consisting of CdZnTe, HgCdTe, HgZnTe, ZnS, CdS, CdTe, ZnSe, CdSe, GaSb, InAs, InSb, InAsSb, PbTe, PbS, PbSe, and combinations thereof;
a third electrode;
a fourth electrode; and
a thermal harvester attached to the buffer layer and electrically connected between the third and fourth electrodes, comprising
an absorption layer attached to the buffer layer, comprising
a first material of p or n type layer; and
a second material of n or p type layer,
wherein the first and the second materials layers forming at least one second p-n or p-i-n junctions with an additional intrinsic or low doped material layer in between the first and second material layers providing an open circuit voltage and the at least one second p-i-n junction comprising cutoff wavelengths between 2 µm to 40 µm;
wherein the fourth electrode electrically connects to the absorption layer comprising of the at least one second p-n or p-i-n junction and insulated from a conductive material that encircles the fourth electrode;
at least one layer of plasmonic nanostructures within and/or outside the absorption layer,
wherein the plasmonic structure is in the first or the second material layer forming the at least one second p-n or p-i-n junction when the plasmonic structure is inside the absorption layer, wherein the substrate electrically isolates the solar harvester, from the thermal harvester.

7. The perpetual-energy harvester in claim 6, wherein:
the at least one layer of plasmonic nanostructures within the absorption layer is embedded within the first or the second material layers.

8. The perpetual-energy harvester in claim 7, wherein:
the arrangement of the at least one layer of plasmonic nanostructures is selected from a group consisting of a uniform distance between nanostructures, a random distance between nanostructures, and a periodic distance between nanostructures.

9. The perpetual energy harvester in claim 7, wherein:
the at least one layer of plasmonic nanostructures comprises a material layer, wherein the at least one layer of nanostructure is opposite type from the first or the second material layer in which it is embedded.

10. The perpetual energy harvester in claim 6, wherein:
the absorption layer further comprises a third material, wherein the third material is intrinsic, located between the first and the second materials, and the at least one layer of plasmonic nanostructures is embedded within the third material.

11. The perpetual energy harvester in claim 6, wherein:
the at least one layer of plasmonic nanostructures comprise an intrinsic material, wherein the at least one layer of plasmonic nanostructures is located between the first and second materials comprising the absorption layer.

12. A perpetual energy harvester configured to harvest energy during day and/or night, comprising:
a substrate formed from an insulator or a conductive material, wherein the substrate has a first surface and a second surface;
a first electrode;
a second electrode;
a solar harvester on the first surface of the substrate and electrically connected between the first and second electrodes, comprising:
at least one first p-n or p-i-n junction formed on or into the substrate, wherein the at least one first p-n or p-i-n junction comprising cutoff wavelengths between 0.3 µm to 2.5 µm;
a buffer layer directly attached to the second surface of the substrate harvester wherein the buffer layer comprises a semiconductor material from a group consisting of CdZnTe, HgCdTe, HgZnTe, ZnS, CdS, CdTe, ZnSe, CdSe, GaSb, InAs, InSb, InAsSb, PbTe, PbS, PbSe, and combinations thereof;
a third electrode;
a fourth electrode; and
a thermal harvester attached to the buffer layer and electrically connected between the third and fourth electrodes, comprising
an absorption layer attached to the buffer layer, comprising
a first material of p or n type layer; and
a second material of n or p type layer, wherein the first and the second material layers forming at least one second p-n or p-i-n junction with an additional intrinsic or low doped material layer in between the first and second material layers and providing an open circuit voltage and the at least one second p-n or p-i-n junction comprising cutoff wavelengths between 2 µm to 40 µm, wherein the fourth electrode electrically connects to the absorption layer comprising of the at least one second p-n or p-i-n junction and insulated from a conductive material that encircles the fourth electrode, and;

at least one layer of plasmonic nanostructures located between the second surface of the substrate and the at least one second p-n or p-i-n junctions, forming the absorption layer of the thermal harvester, wherein the substrate electrically isolates the said solar harvester, from the thermal harvester.

13. The perpetual energy harvester in claim 12, wherein: the at least one layer of plasmonic nanostructure comprises metal nanostrips in a periodic arrangement, wherein the plasmonic nanostructures are located on a surface of the absorption layer.

14. The perpetual energy harvester as in claim 12, wherein:

the at least one layer of plasmonic nanostructures comprises metal nanostrips arranged in a configuration selected from a group consisting of concentric circles, concentric polygons, and spirals, wherein the plasmonic nanostructures are located on a surface of the absorption layer and the configuration creates a periodic arrangement between the plasmonic nanostructures.

15. The perpetual-energy harvester as in claim 12, wherein the at least one layer of plasmonic nanostructures comprises a periodic arrangement of nanostructures with designated distances between nanostructures to filter specific wavelengths of radiation and the absorption layer under the at least one layer of plasmonic nanostructures comprises a section of material with corresponding cutoff wavelengths to the specific wavelengths of radiation filtered.

16. The perpetual energy harvester as in claim 15, further comprising: at least one insulator between the section of material comprising the absorption layer having different cutoff wavelengths.

17. A perpetual energy harvester configured to harvest energy during day and/or night comprising:

a substrate comprising a electrically conductive material of a first type of p or n, wherein the substrate has a first surface and a second surface;

a first electrode electrically connected to the substrate, wherein the first electrode being insulated from a conductive material that encircles the first electrode;

a solar harvester made into the substrate or on the first surface of the substrate comprising a material of a second type of n or p creating a first p-n or p-i-n junction, wherein the first p-n or p-i-n junction comprises a cutoff wavelength between 0.3 µm and 2.5 µm;

a second electrode, a buffer layer comprising a material of the first type directly attached to the second surface of the substrate, wherein the buffer layer comprises a semiconductor material from a group consisting of CdZnTe, HgCdTe, HgZnTe, ZnS, CdS, CdTe, ZnSe, CdSe AlGaSb, GaSb, InAs, InSb, InAsSb, PbTe, PbS, PbSe, and combinations thereof;

an absorption layer attached to the buffer layer comprising, a first material of the second type layer;

a second material of the first type layer, wherein the first and second material layers comprise at least one second p-n or p-i-n junction with an additional intrinsic or low doped material layer in between the first and second material layers and providing an open circuit voltage and the at least one second p-n or p-i-n junction comprising cutoff wavelengths between 2 µm to 40 µm;

a third electrode electrically connected to the absorption layer, wherein the at least one second p-n or p-i-n junction is between the third electrode and the substrate.

18. The perpetual energy harvester in claim 17, further comprising:

a fourth electrode electrically connected to a group selected from, the buffer layer and the absorption layer, wherein the at least one second p-n or p-i-n junction is between the third electrode and fourth electrode.

19. The perpetual energy harvester in claim 17, further comprising:

at least one layer of plasmonic nanostructures located between the second surface of the substrate and the at least one second p-n or p-i-n junctions, forming the absorption layer of the thermal harvester.

20. The perpetual energy harvester in claim 19, wherein the at least one layer of plasmonic nanostructures within the absorption layer is embedded within the first or the second material layers.

* * * * *